(12) United States Patent
Yamakawa

(10) Patent No.: US 8,534,780 B2
(45) Date of Patent: Sep. 17, 2013

(54) RACK APPARATUS

(75) Inventor: Kengo Yamakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 12/833,366

(22) Filed: Jul. 9, 2010

(65) Prior Publication Data

US 2011/0011817 A1 Jan. 20, 2011

(30) Foreign Application Priority Data

Jul. 14, 2009 (JP) .................. 2009-166088

(51) Int. Cl.
*A47B 81/00* (2006.01)
*A47B 97/00* (2006.01)

(52) U.S. Cl.
USPC .......................................... 312/273

(58) Field of Classification Search
USPC .............. 312/273, 286, 310, 334.4, 351, 271, 312/223.1, 223.2; 211/26, 153, 134; 248/298.1, 250; 74/25, 47–50
See application file for complete search history.

(56) References Cited

U.S. PATENT DOCUMENTS

| | | | | |
|---|---|---|---|---|
| 2,611,675 A * | 9/1952 | Palmer | 312/351 |
| 2,614,019 A * | 10/1952 | Olson et al. | 312/273 |
| 2,865,698 A * | 12/1958 | Smith | 312/35 |
| 3,726,581 A * | 4/1973 | Doepke | 312/351 |
| 3,799,640 A * | 3/1974 | Jacobs | 312/273 |
| 3,862,788 A * | 1/1975 | Hock et al. | 312/294 |
| 4,002,398 A * | 1/1977 | Hanisch et al. | 439/713 |
| 4,191,295 A * | 3/1980 | Tams, III | 211/41.1 |
| 4,624,511 A * | 11/1986 | Oehme | 312/273 |
| 5,115,822 A * | 5/1992 | Nichols | 134/135 |
| 5,971,513 A * | 10/1999 | Cassalia | 312/310 |
| 6,464,085 B1 * | 10/2002 | Chin et al. | 211/26 |
| 6,885,550 B1 * | 4/2005 | Williams | 361/679.33 |
| 7,318,531 B2 * | 1/2008 | Wu | 211/26 |
| 7,445,126 B2 * | 11/2008 | Wilson et al. | 211/1.51 |
| 7,907,402 B2 * | 3/2011 | Caveney | 361/694 |
| 8,061,535 B2 * | 11/2011 | Cheng-Yuan et al. | 211/26 |
| 2002/0140327 A1 * | 10/2002 | Kim | 312/311 |
| 2005/0194328 A1 * | 9/2005 | Su | 211/26 |
| 2007/0082772 A1 * | 4/2007 | Aulanko et al. | 474/84 |
| 2007/0175835 A1 * | 8/2007 | Liang | 211/26 |
| 2008/0035588 A1 * | 2/2008 | Liang | 211/26 |
| 2008/0175659 A1 * | 7/2008 | Mimlitch et al. | 403/384 |
| 2008/0238278 A1 * | 10/2008 | Jeong et al. | 312/404 |
| 2009/0085450 A1 * | 4/2009 | Li | 312/333 |
| 2009/0122484 A1 * | 5/2009 | Caveney | 361/692 |
| 2009/0139259 A1 * | 6/2009 | Kang | 62/441 |
| 2012/0091075 A1 * | 4/2012 | Chapel et al. | 211/26 |

FOREIGN PATENT DOCUMENTS

| | | |
|---|---|---|
| JP | 61-253896 A | 11/1986 |
| JP | 62-243398 A | 10/1987 |
| JP | 5-44857 U | 6/1993 |
| JP | 2000-232272 A | 8/2000 |
| JP | 2002-177068 A | 6/2002 |
| JP | 2003-142859 A | 5/2003 |

* cited by examiner

*Primary Examiner* — Darnell Jayne
*Assistant Examiner* — Hiwot Tefera
(74) *Attorney, Agent, or Firm* — Fujitsu Patent Center

(57) ABSTRACT

A rack apparatus has a movable member for holding a first article, and a second movable member for holding a second article, the first and second movable members being arranged vertically, a base member for holding the first movable member and the second movable member so as to be movable forward and backward horizontally, and a linking member for linking the first movable member and the second movable member so as to enable the second movable member to move backward when the first movable member moving forward.

5 Claims, 27 Drawing Sheets

RELATED ART

FIG. 14A
FIG. 14B
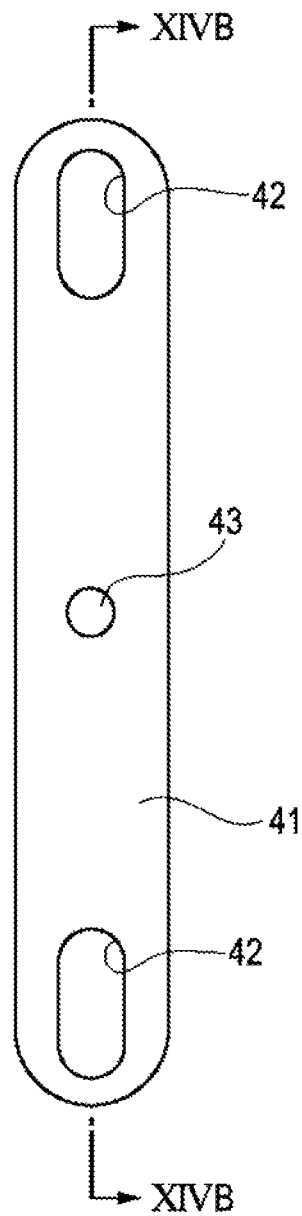
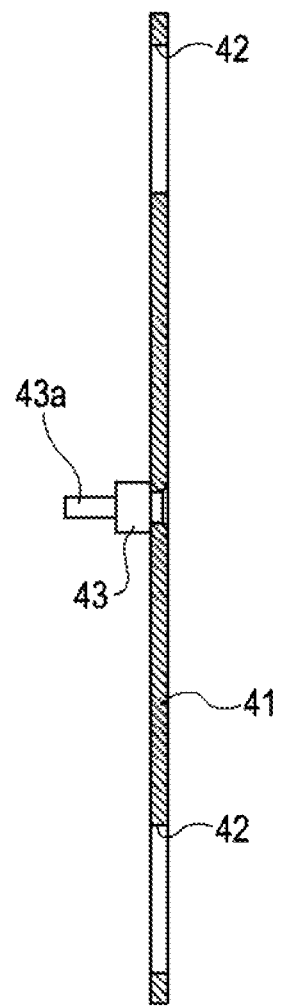

44

44

32

32

32a

32

FIG. 30A
FIG. 30B
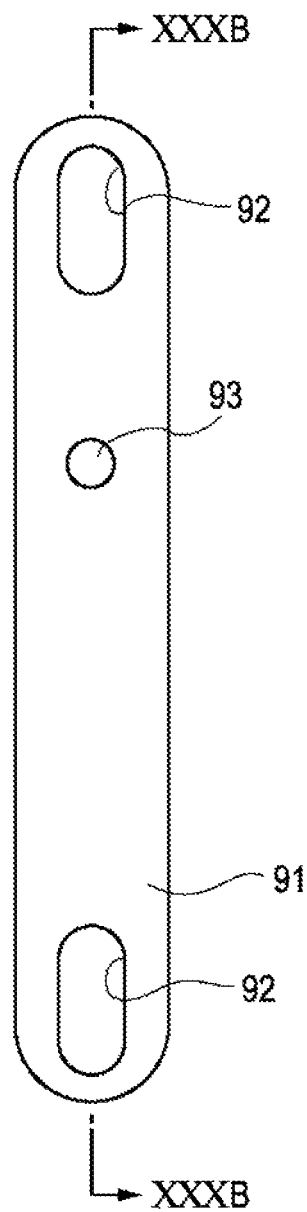
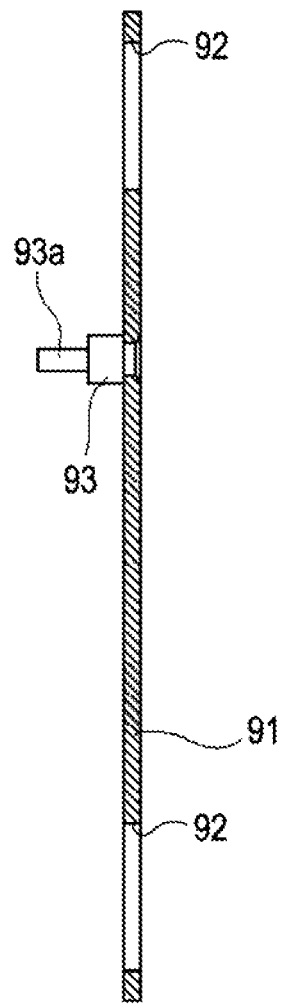

RACK APPARATUS

CROSS-REFERENCE TO RELATED APPLICATION

This application is based upon and claims the benefit of priority of the prior Japanese Patent Application No. 2009-166088, filed on Jul. 14, 2009, the entire contents of which are incorporated herein by reference.

FIELD

The present art relates to a rack apparatus.

BACKGROUND

A rack apparatus that holds and encloses electronic devices is widely used. Various proposals to improve such a rack apparatus are known (for example, Japanese Laid-Open Patent Publication No. 2003-142859).

The above rack apparatus sometimes holds and encloses a plurality of articles, for example, electronic devices such as a server device and a tape library device, one just above the other. The electronic devices enclosed in the rack apparatus are sometimes attached to rail devices, for maintenance and inspection of the electronic devices.

When articles are held in vertically-arranged tiers, the work on an article held in a tier may be interfered with by an article held in another tier.

SUMMARY

According to an aspect of an embodiment, a rack apparatus has a first movable member for holding a first article, and a second movable member for holding a second article, the first and second movable members being arranged vertically, a base member for holding the first movable member and the second movable member so as to be movable forward and backward horizontally, and a linking member for linking the first movable member and the second movable member so as to enable the second movable member to move backward when the first movable member moving forward.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 14A and 14B are explanatory views of a linking member;

FIGS. 30A and 30B are explanatory views of a linking member of a fifth embodiment.

DESCRIPTION OF EMBODIMENTS

The embodiments of the present art will now be described with reference to the accompanying drawings. It is noted that in the figures the dimensions and proportions of elements may not be completely to scale. It also is noted that in some figures details have been omitted.

Figure 1:
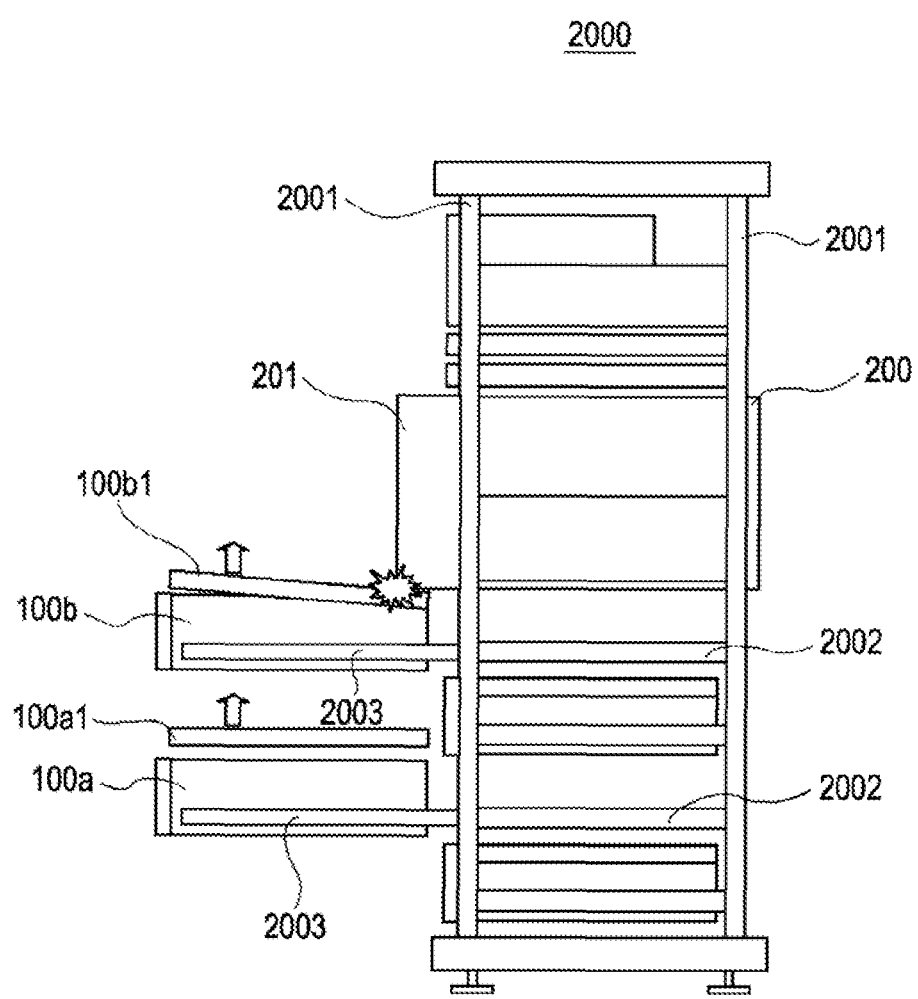
FIG. 1 is an explanatory view of the problem with a rack apparatus.

A known rack apparatus 2000 will be described with reference to FIG. 1. The rack apparatus 2000 has pillar members 2001 arranged opposite each other and rail devices 2002 horizontally attached to the pillar members 2001. The rail devices 2002 have slidable holding members 2003. A first server device 100a and a second server device 100b are attached to the holding members 2003 of the rail devices 2002. A tape library device 200 is attached to the pillar members 2001. The tape library device 200 is fixed to the pillar members 2001. The tape library device 200 has a front panel 201. The front panel 201 projects more forward than the front ends of the first server device 100a and the second server device 100b that are completely enclosed in the rack apparatus 2000 using the rail devices 2002. The amount of projection of a front panel of an electronic device varies depending on the type and manufacturer of the electronic device. For this reason, the front panel 201 sometimes projects as illustrated in FIG. 1.

The first server device 100a and the second server device 100b are pulled out forward using the rail devices 2002, for maintenance and inspection. As illustrated in FIG. 1, in the case of the first server device 100a, the front end of the electronic device just above it does not project, and therefore the lid member 100a1 can be removed. However, the lid member 100b1 of the second server device 100b is interfered with by the front panel 201 overhanging it. For this reason, the lid member 100b1 cannot be removed, and the second server device 100b cannot undergo maintenance and inspection.

First Embodiment

Figure 2:
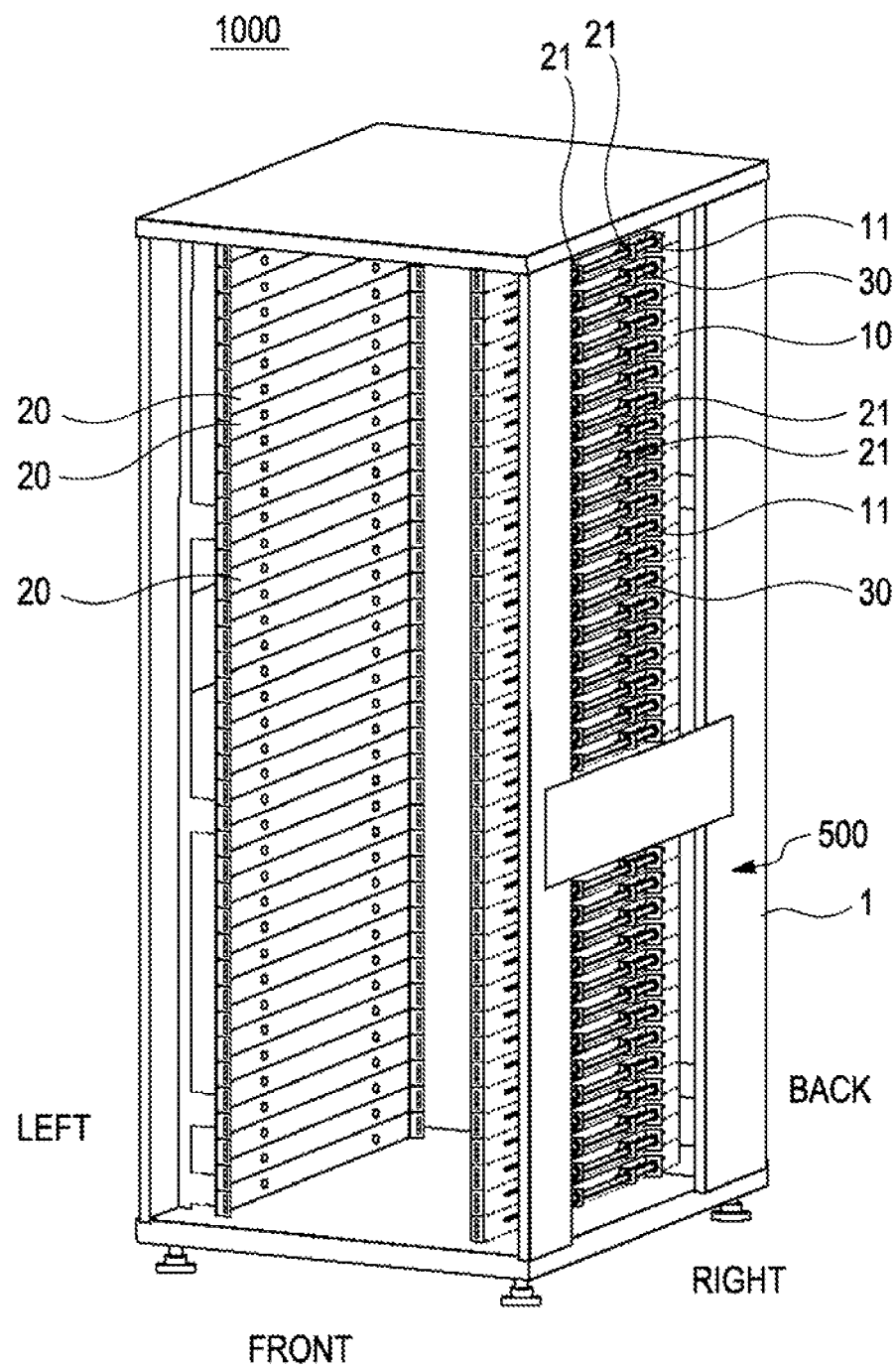
FIG. 2 is a perspective view of a rack apparatus of a first embodiment.
Figure 16:
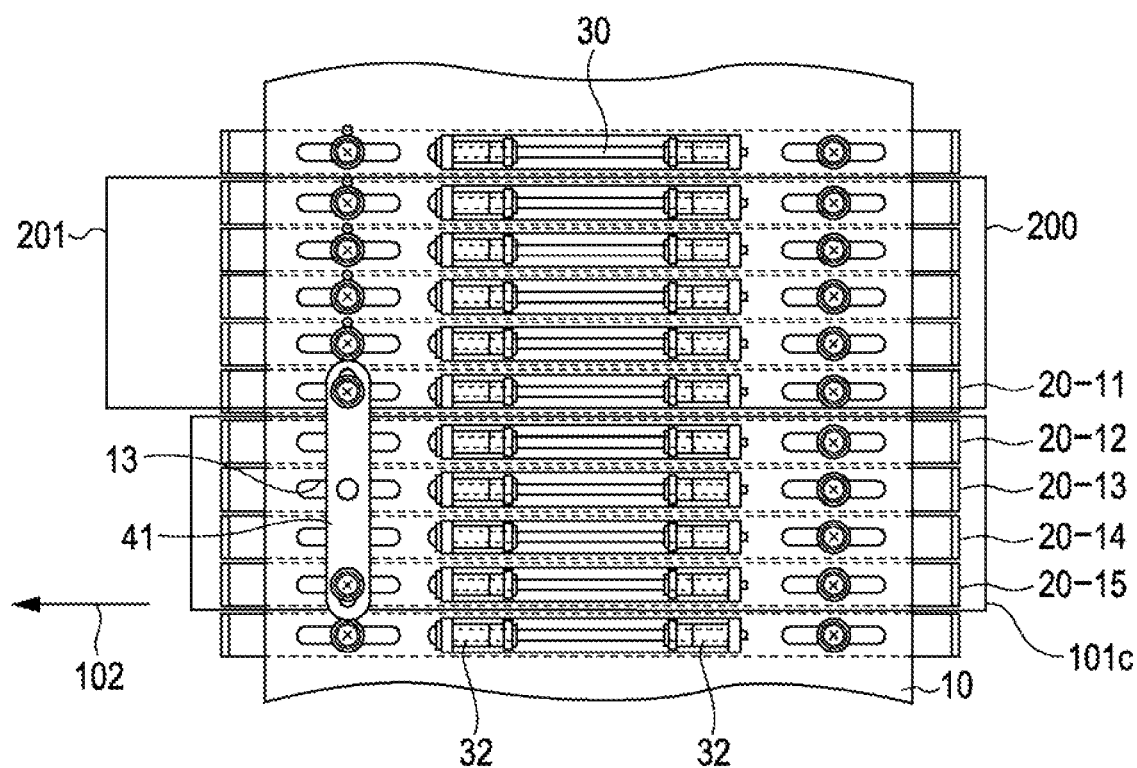
FIG. 16 is an explanatory view of a state where a server device and a tape library device held by the article holding device are enclosed in the rack apparatus.

FIG. 2 is a perspective view of a rack apparatus 1000 of a first embodiment. The rack apparatus 1000 has an article holding device 500 in a housing 1. In the first embodiment, any articles may be held by the article holding device 500. For example, electronic devices such as a server device 101c and a tape library device 200 such as those illustrated in FIG. 16 are suitable as articles to be held. These electronic devices are sometimes pulled out from the rack apparatus 1000 forward or backward and undergo maintenance and inspection. The article holding device 500 is advantageous in that, when the electronic devices undergo maintenance and inspection, the interference between the electronic devices can be avoided. Hereinafter, for ease of explanation, the front, back, left, and right of the rack apparatus 1000 will be defined as illustrated in FIG. 2.

The article holding device 500 has a plurality of movable members 20 to which articles to be held are attached. The movable members 20 are arranged vertically as illustrated in FIG. 2. The movable members 20 are attached to plate-like base members 10 so as to be movable forward and backward.

In the rack apparatus standards, 1 U=44.45 mm is specified as the smallest unit of the dimension in the height direction. The height of each movable member 20 corresponds to 1 U.

Figure 3:
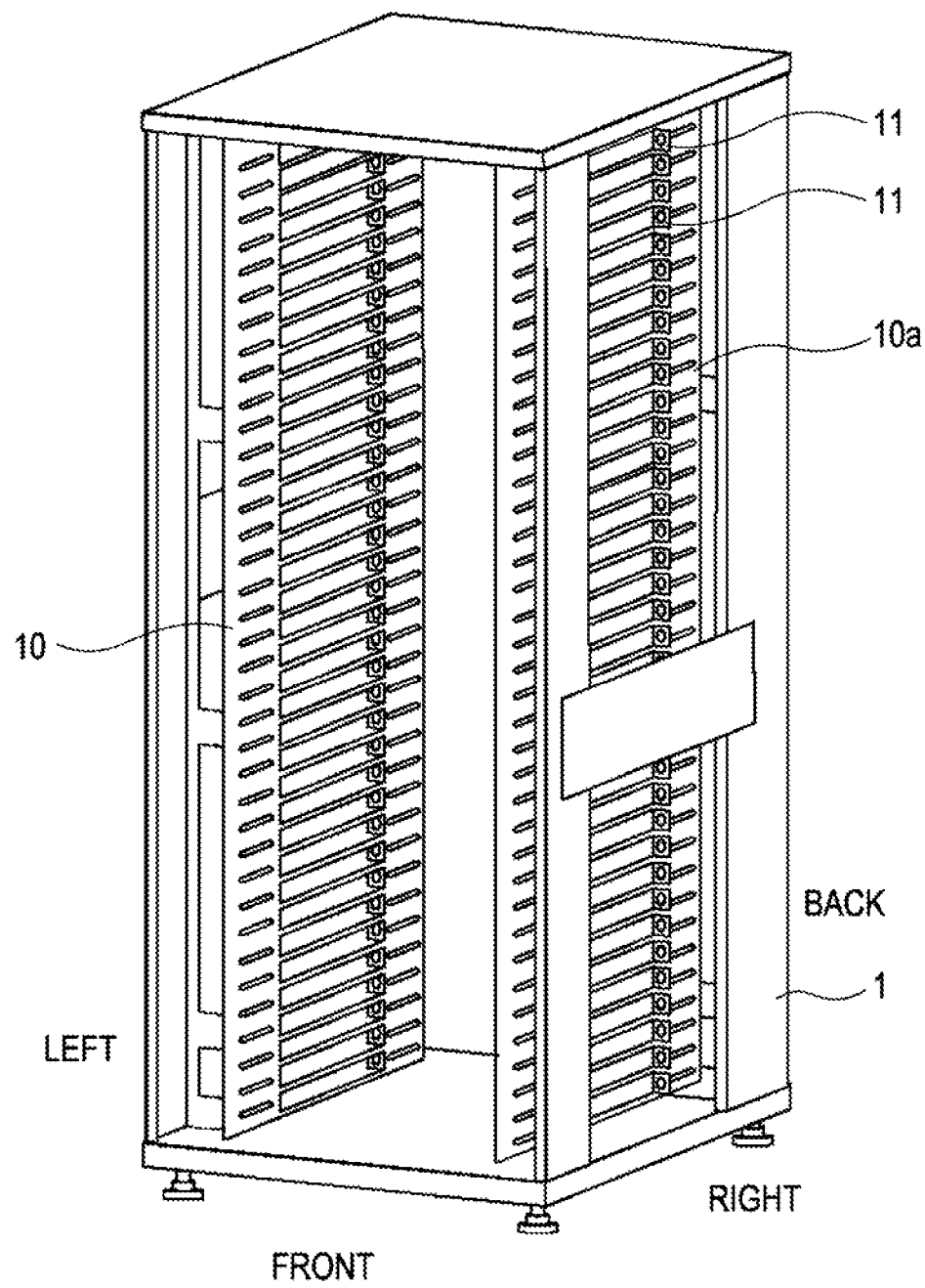
FIG. 3 is a perspective view of the rack apparatus with movable members removed from base members.

FIG. 3 is a perspective view of the rack apparatus 1000 with the movable members 20 removed from the base members 10 included in the article holding device 500. The base members 10 are plate-like members. The article holding device 500 has two base members 10. The two base members 10 are provided in the housing 1. The two base members 10 are arranged opposite each other in the housing 1. The base members 10 are disposed on the right and left sides of the housing 1.

Figure 4B:
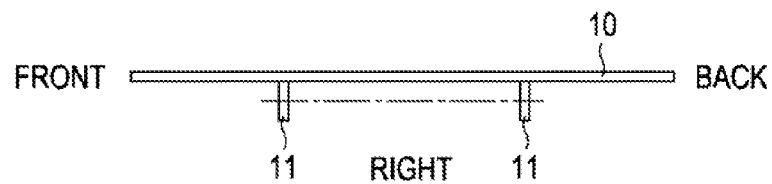
FIGS. 4A to 4C are explanatory views illustrating part of one of the base members.
Figure 4C:
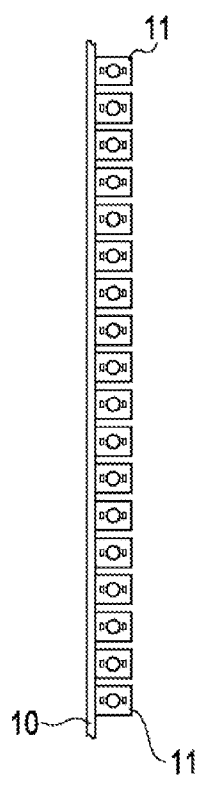
Figure 4A:
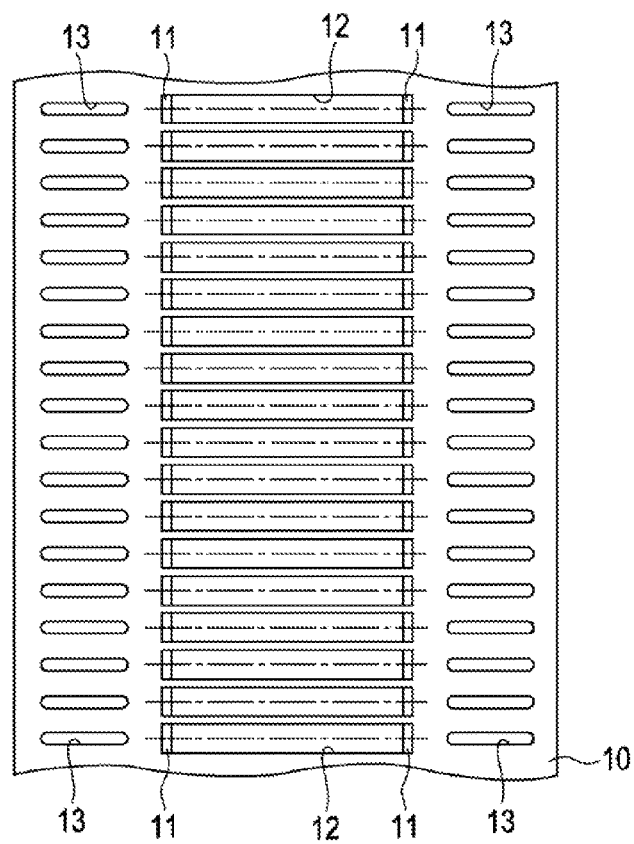

FIGS. 4A to 4C are explanatory views illustrating part of one of the base members 10. More specifically, FIG. 4A is a right side view of part of the base member 10; FIG. 4B is a top view of part of the base member 10; and FIG. 4C is a front view of part of the base member 10. As illustrated in FIG. 4B, the base member 10 has shaft member attaching portions 11 provided so as to project outward. As illustrated in FIG. 4B, the shaft member attaching portions 11 form front and back pairs.

Figure 9A:
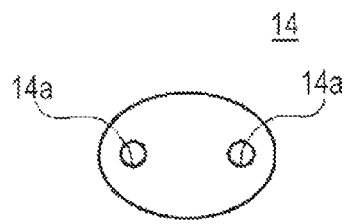
FIGS. 9A to 9J are explanatory views of various components used in an article holding device.

The base member 10 has an opening 12 between each front and back pair of the shaft member attaching portions 11. In addition, the base member 10 has raceway slots 13 in front of and behind each opening 12. Two shaft member attaching portions 11, an opening 12, and two raceway slots 13 form a group and are aligned in the front-back direction. This group forms a tier. The base member 10 are provided with a plurality of such tiers arranged vertically as illustrated in FIGS. 4A and 4C. To each tier is attached a movable member 20 to be hereinafter described in detail. Between the two shaft member attaching portions 11 is attached a shaft member 30 extending in the front-back direction. As will hereinafter be described in detail, the shaft member 30 is attached between the two shaft member attaching portions 11 using a cover member 14 illustrated in FIG. 9A.

Figure 5A:
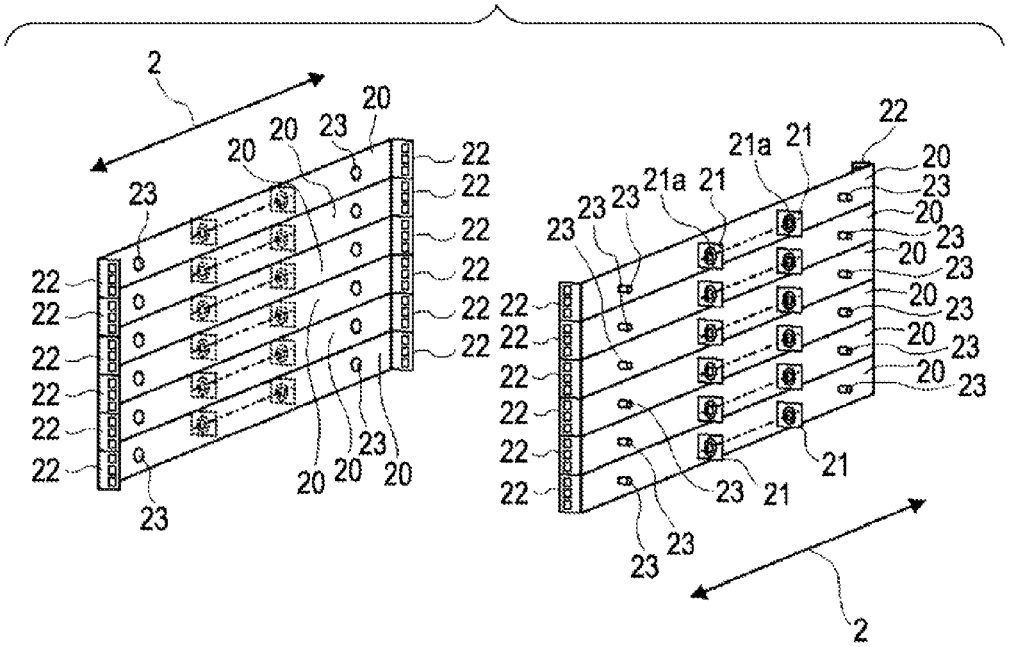
FIG. 5A illustrates the arrangement of movable members.
Figure 5B:
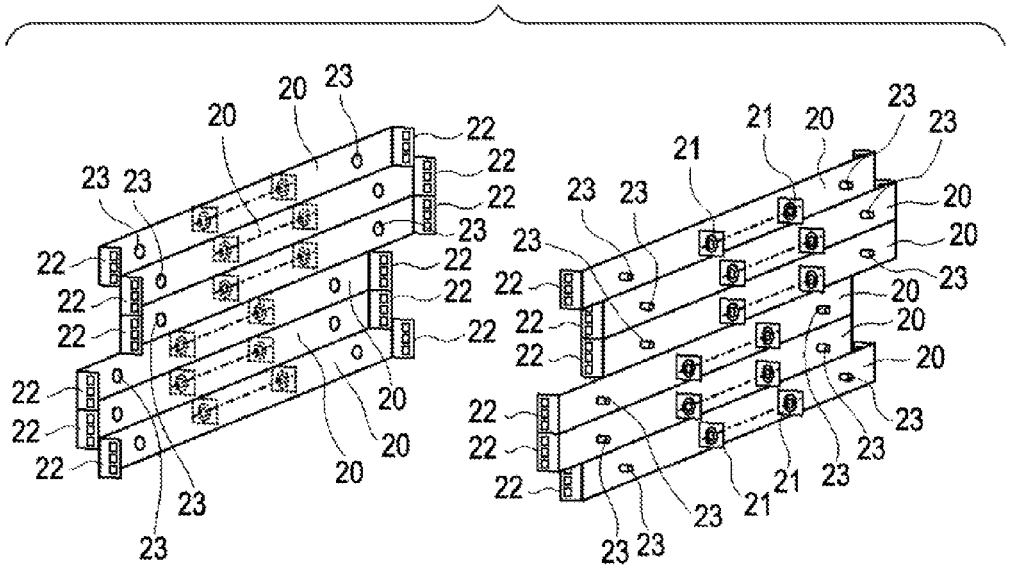
FIG. 5B is an explanatory view illustrating the movement of the movable members.

FIG. 5A illustrates the arrangement of the movable members 20. FIG. 5B is an explanatory view illustrating the movement of the movable members 20. FIGS. 5A and 5B illustrate six tiers on both the right and left sides.

The movable members 20 have sliding portions 21 that are slidably attached to the shaft members 30. Specifically, each movable member 20 has a pair of sliding portions 21 on a plate-like body that extends in the front-back direction. The sliding portions 21 are flange-shaped and are provided in the movable member 20 so as to project laterally. The sliding portions 21 each have an insertion hole 21a through which a shaft member 30 is passed. The movable member 20 further has a pair of device supporting portions 22 that support an article to be moved, which is a device such as a server device 101c illustrated in FIG. 16 in this embodiment. The device supporting portions 22 are flange-shaped portions provided at the front and back ends of the movable member 20. The device supporting portions 22 are provided in the movable member 20 so as to project in a direction different from the direction in which the sliding portions 21 project.

Figure 9B:
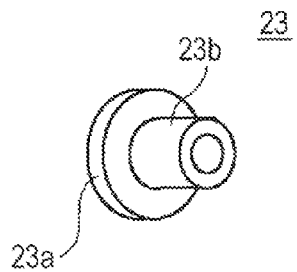
Figure 9C:
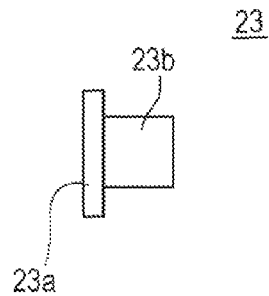

To the movable members 20 are attached pin members 23. FIG. 9B is a perspective view of a pin member 23. FIG. 9C is a side view of the pin member 23. The pin member 23 has a flange portion 23a and a cylindrical portion 23b. The pin members 23 are attached in front of and behind the sliding portions 21. The pin members 23 are provided in the movable members 20 in such a manner that the cylindrical portions 23b project in the same direction as the sliding portions 21.

Such movable members 20 are attached to the base members 10 so as to be movable forward and backward. Thus, as illustrated in FIG. 5B, the movable members 20 can be moved separately forward and backward.

Figure 6:
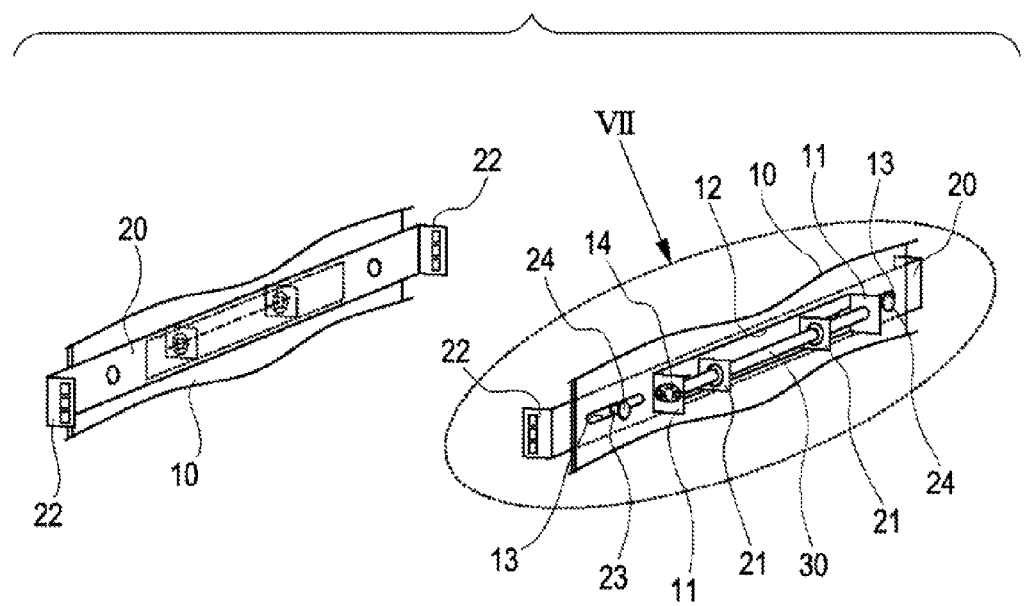
FIG. 6 is an explanatory view illustrating the movable members attached to the base members.
Figure 7:
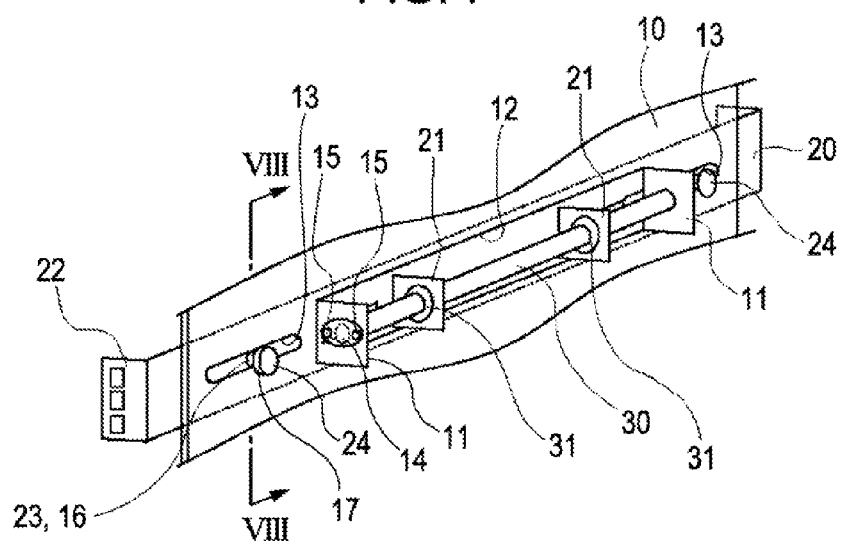
FIG. 7 is an enlarged explanatory view illustrating the part VII in FIG. 6.
Figure 8:
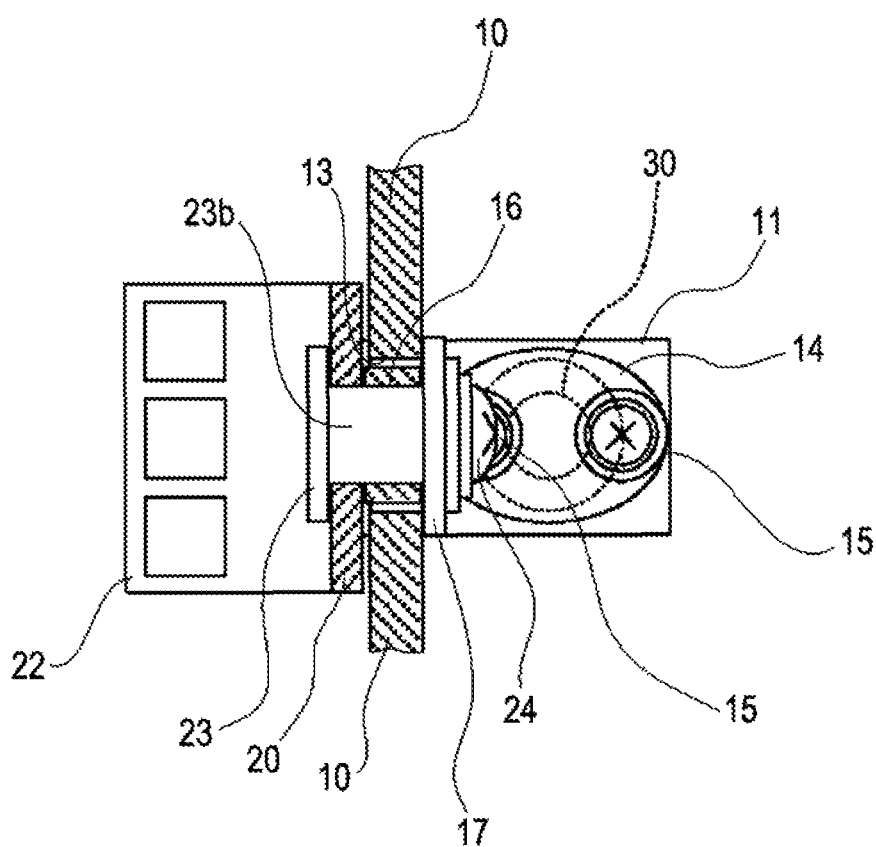
FIG. 8 is a sectional view taken along line VIII-VIII of FIG. 7.

The attachment of the movable members 20 to the base members 10 will be described with reference to FIGS. 6 to 8. FIG. 6 is an explanatory view illustrating the movable members 20 attached to the base members 10. FIG. 7 is an enlarged explanatory view illustrating the part VII in FIG. 6. FIG. 8 is a sectional view taken along line VIII-VIII of FIG. 7.

The movable members 20 are disposed so that their plate-like portions are located on the inner sides of the base members 10 arranged opposite each other. The movable members 20 are placed on the base members 10 in such a manner that the sliding portions 21 project from the openings 12 to the outside of the base members 10, and the cylindrical portions 23b of the pin members 23 project from the raceway slots 13 to the outside of the base members 10.

Figure 9D:
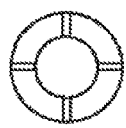
Figure 9E:
Figure 9F:
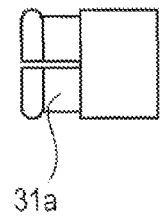

The shaft members 30 are passed through the insertion holes 21a of the sliding portions 21 projecting from the openings 12. In the insertion holes 21a is fitted a bearing cylinder member 31 illustrated in FIGS. 9D to 9F. FIG. 9D is a front view of the bearing cylinder member 31. FIG. 9E is a perspective view of the bearing cylinder member 31. FIG. 9F is a side view of the bearing cylinder member 31. The bearing cylinder member 31 has a groove 31a formed in the outer circumference thereof. By engaging the groove 31a with the edge of the insertion hole 21a, the bearing cylinder member 31 is fitted in the insertion hole 21a. The bearing cylinder member 31 slides relative to the shaft member 30. Therefore, the movable members 20 are slidable relative to the shaft members 30.

One end of the shaft member 30 passed through the insertion holes 21a is tapered and fitted in a hole provided in the back shaft member attaching portion 11. The front shaft member attaching portion 11 is also provided with a hole. The shaft member 30 is passed through this front hole and is then fitted into the back shaft member attaching portion 11. The front hole is covered by the cover member 14. The cover member 14 has screw holes 14a and is attached to the shaft member attaching portion 11 with screw members 15. The shaft member 30 is thereby attached between the shaft member attaching portions 11. The movable member 20 with the shaft member 30 passed through the sliding portions 21 can move along the shaft member 30 in the front-back direction.

Figure 9G:
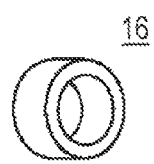
Figure 9H:
Figure 9I:
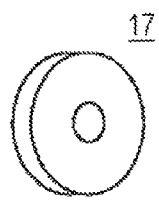
Figure 9J:
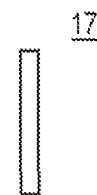

The cylindrical portions 23b of the pin members 23 provided on the movable member 20 project from the raceway slots 13. In the cylindrical portions 23b are screwed screw members 24. To the outsides of the cylindrical portions 23b is attached a bearing cylinder member 16 illustrated in FIGS. G and 9H. FIG. 9G is a perspective view of the bearing cylinder member 16. FIG. 9H is a side view of the bearing cylinder member 16. The bearing cylinder member 16 attached to the cylindrical portions 23b makes the pin members 23 smoothly slidable relative to the raceway slots 13. Between the cylindrical portions 23b and the screw members 24 is disposed a ring-like washer member 17 illustrated in FIGS. 9I and 9J. FIG. 9I is a perspective view of the washer member 17. FIG. 93 is a side view of the washer member 17. By attaching this washer member 17, the bearing cylinder members 16 can be prevented from falling off.

Figure 10:
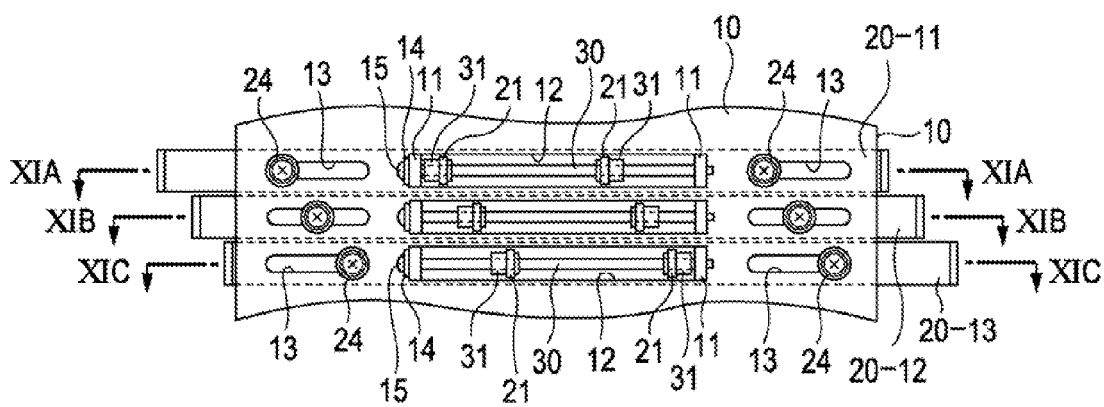
FIG. 10 is an explanatory view illustrating how movable members are moved forward or backward.

The movement of the movable members 20 attached to the base members 10 as described above will be described with reference to FIGS. 10 and 11. In FIG. 10, for convenience of explanation, only 3 U, that is to say, three movable members 20 are illustrated. The three movable members 20 are denoted by reference numerals 20-11, 20-12, and 20-13 in order from the top.

Figure 11A:
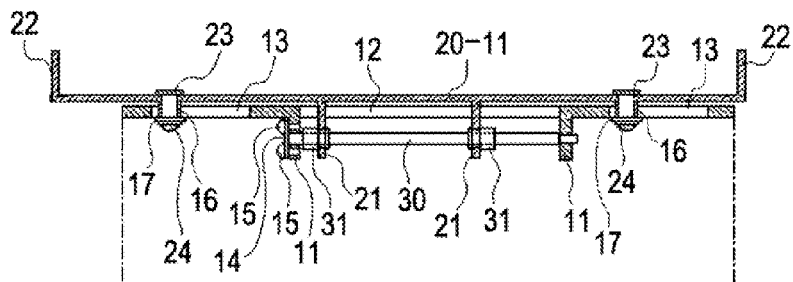
FIG. 11A is a sectional view taken along line XIA-XIA of FIG. 10.
Figure 11B:
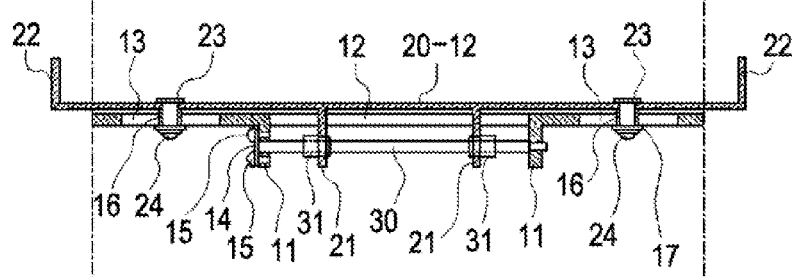
FIG. 11B is a sectional view taken along line XIB-XIB of FIG. 10.
Figure 11C:
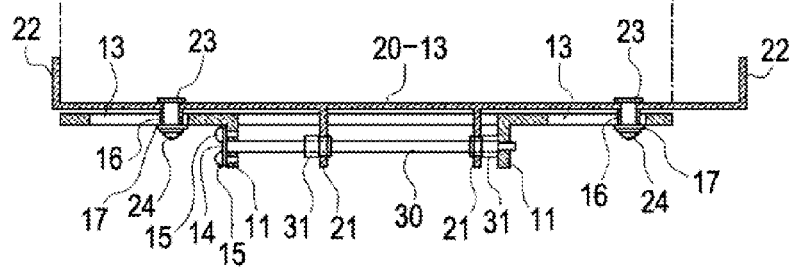
FIG. 11C is a sectional view taken along line XIC-XIC of FIG. 10.

The movable member 20-11 in FIG. 10 has been moved forward. The movable member 20-12 in FIG. 10 is in the enclosed position. The movable member 20-13 in FIG. 10 has been moved backward. FIG. 11A is a sectional view taken along line XIA-XIA of FIG. 10. FIG. 11B is a sectional view taken along line XIB-XIB of FIG. 10. FIG. 11C is a sectional view taken along line XIC-XIC of FIG. 10. As illustrated in these, the movable members 20 can be moved from their enclosed positions in the front-back direction. By moving a movable member 20 forward and moving another movable member 20 backward, the interference between the electronic devices held by these movable members 20 can be avoided.

Since the movable members 20-11 to 20-13 can be moved separately forward and backward as described above, a desired one of the movable members 20 can be moved forward or backward according to the demand of the devices held by the article holding device 500.

Figure 12A:
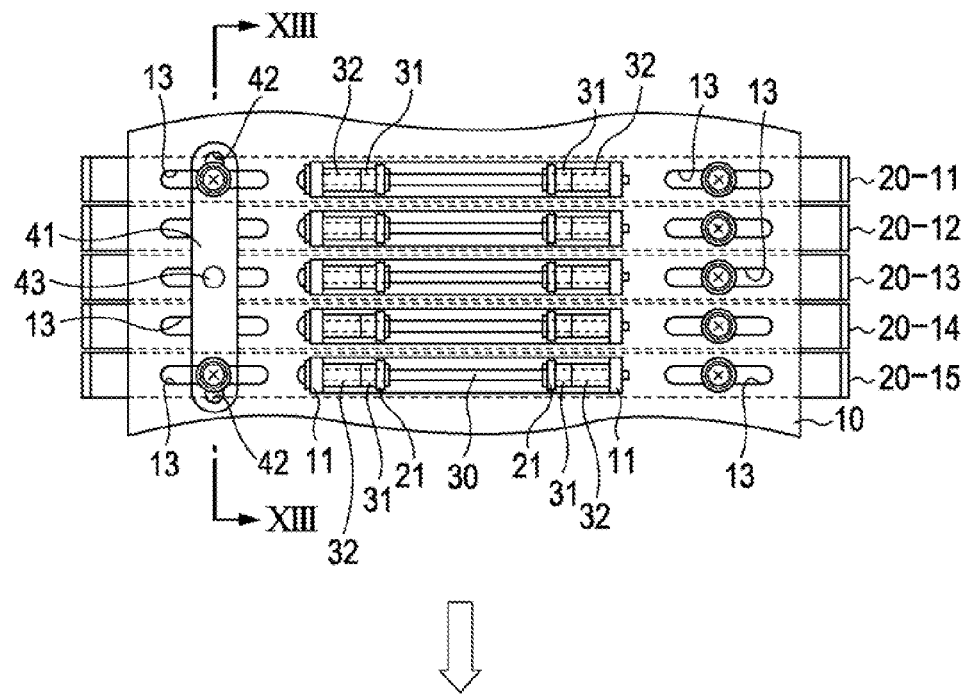
FIGS. 12A and 12B are explanatory views illustrating how movable members of the first embodiment are moved forward or backward.
Figure 12B:
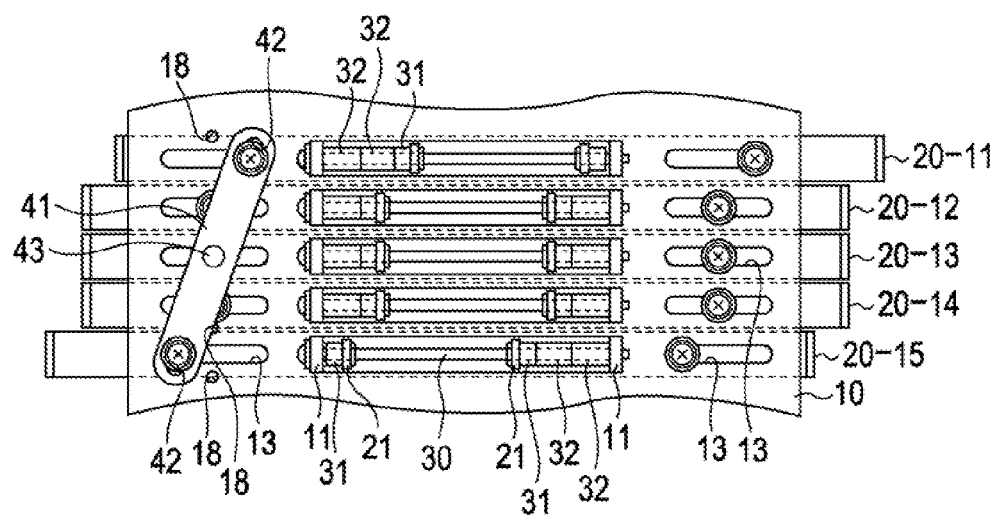

The article holding device 500 of this embodiment further has a plate-like linking member 41 that links the movable members 20. FIGS. 12A and 12B illustrate five movable members 20-11 to 20-15. Of the five movable members 20-11 to 20-15, the movable member 20-11 serves as a first movable member, and the movable member 20-15 serves as a second movable member. The first movable member 20-11 and the second movable member 20-15 are linked with the linking member 41. FIG. 12A illustrates a state where the five movable members 20 are all in their enclosed position. FIG. 12B illustrates a state where the second movable member 20-15 has been moved forward and the first movable member 20-11 has been moved backward. By using the linking member 41, when one of the first movable member 20-11 and the second movable member 20-15 is moved forward, the other can be moved backward simultaneously.

In this embodiment, as illustrated in FIG. 16 and as will hereinafter be described in detail, it is assumed that a tape library device 200 is disposed just above a server device 101c having a height of 4 U. For this reason, the linking member 41 used in this embodiment links the lowermost, second movable member 20-15 and the first movable member 20-11 located 4 U above the 4 U.

Figure 13:
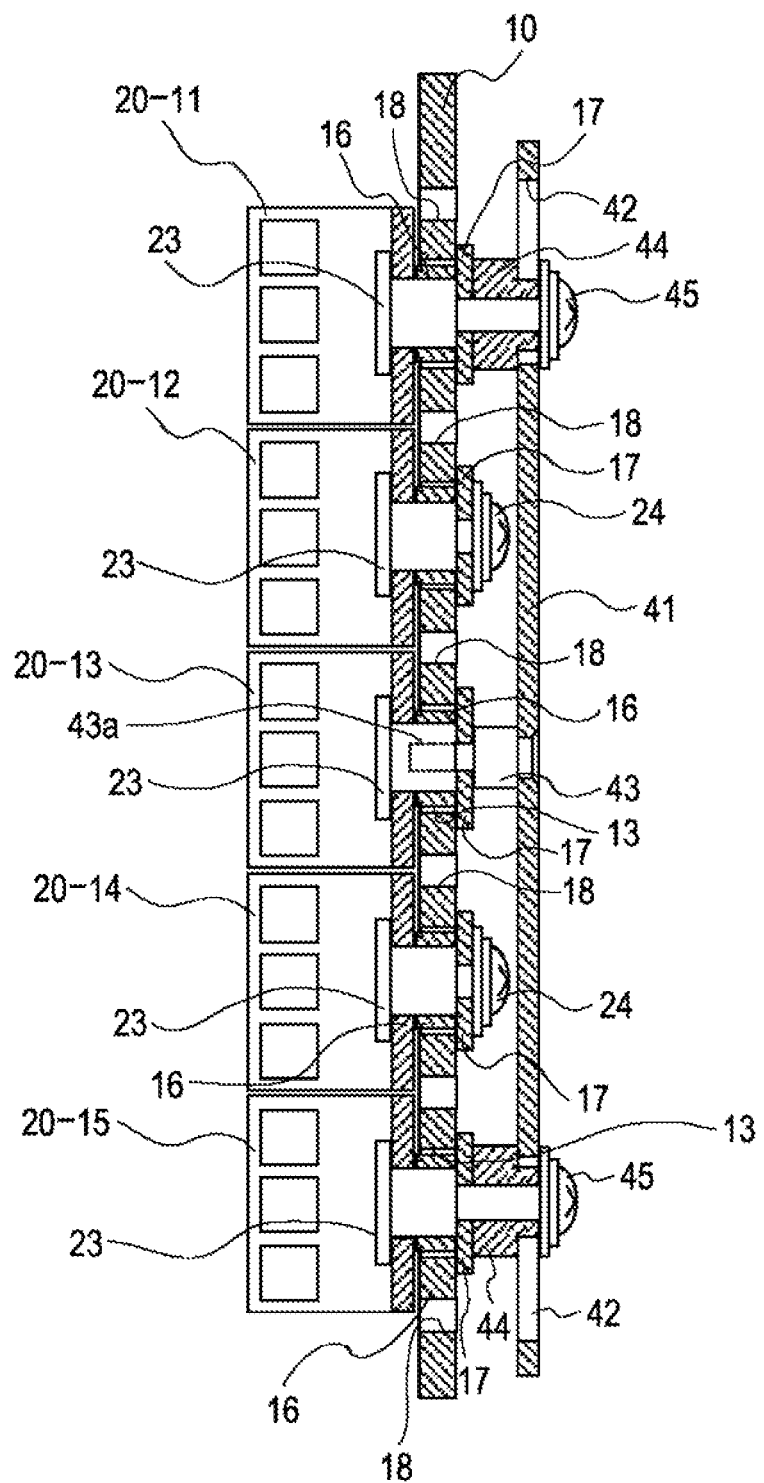
FIG. 13 is a sectional view taken along line XIII-XIII of FIG. 12A.

The linking member 41 will be described in detail. FIG. 13 is a sectional view taken along line XIII-XIII of FIG. 12A. FIGS. 14A and 14B are explanatory views of the linking member 41. More specifically, FIG. 14A is a side view of the linking member 41, and FIG. 14B is a sectional view taken along line XIVB-XIVB of FIG. 14A.

The linking member 41 has an oval slot 42 at each end. In addition, the linking member 41 has a pivot portion 43 in the middle.

Figure 15A:
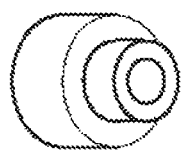
FIGS. 15A to 15E are explanatory views of various components used in an article holding device.
Figure 15B:
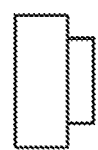

In each oval slot 42 is slidably fitted a bearing cylinder member 44 illustrated in FIGS. 15A and 15B. The bearing cylinder members 44 are, together with the washer members 17 as illustrated in FIG. 13, attached with screw members 45 to the cylindrical portions 23b of the pin members 23. The bearing cylinder members 44 are attached to the pin members 23 of the first movable member 20-11 and the second movable member 20-15. Thus, the first movable member 20-11 and the second movable member 20-15 are linked.

The tip 43a of the pivot portion 43 is, as illustrated in FIG. 13, fitted into the cylindrical portion 23b of the pin member 23 provided in the movable member 20-13. That is to say, instead of the screw members 24 attached to the cylindrical portions 23b of the other pin members 23, the tip 43a is fitted. Also in this case, a bearing cylinder member 16 is attached to the cylindrical portion 23b. The movable member 20-13 is the middle one of the five movable members 20-11 to 20-15. Thus, the linking member 41 is supported by the base member 10 rotatably about the pivot portion 43.

Thus, one of the first movable member 20-11 and the second movable member 20-15 moves in response to the movement of the other.

The first movable member 20-11 described above holds a tape library device 200 as illustrated in FIG. 16. The first movable member 20-11 holds the tape library device 200 with the device supporting portions 22 illustrated in detail in FIG. 6. The tape library device 200 has a height of 5 U and is held by the four movable members 20 located above the first movable member 20-11 as well as by the first movable member 20-11.

Figure 17:
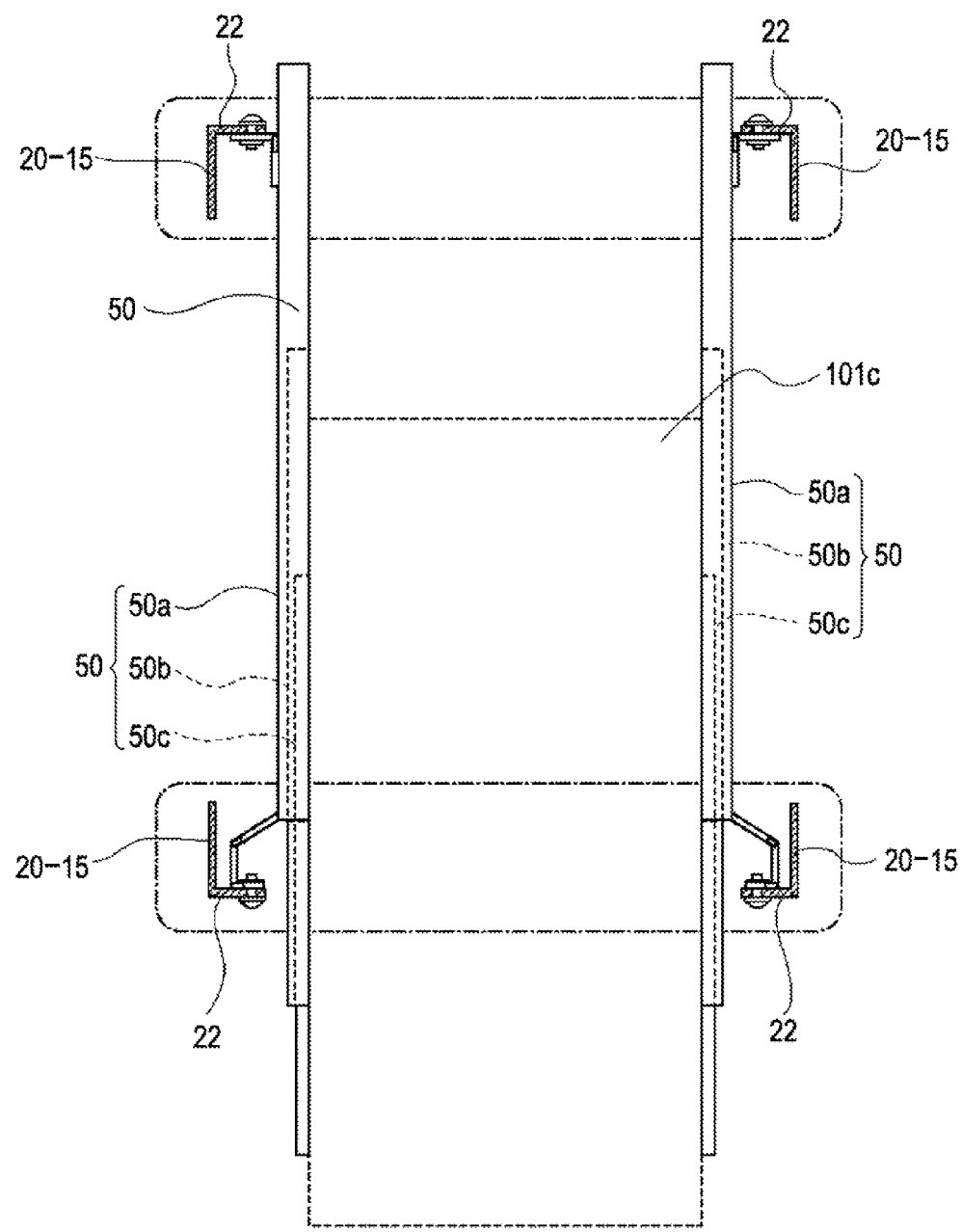
FIG. 17 is an explanatory view of rail devices located between the movable members and the server device.

The second movable member 20-15 holds a server device 101c as illustrated in FIG. 16. To hold the server device 101c, rail devices 50 such as those illustrated in FIG. 17 are used. FIG. 17 is an explanatory view of rail devices 50 located between the movable members 20-15 and the server device 101c. Each rail device 50 has a first rail member 50a, a second rail member 50b, and a holding member 50c so as to be capable of being extended and shortened. The second rail member 50b is movable into and out of the first rail member 50a. The holding member 50c is movable into and out of the second rail member 50b. The server device 101c is attached to the holding members 50c. The first rail members 50a are attached to the device supporting portions 22 of the movable members 20-15. Thus, the server device 101c can be moved using the rail devices 50 and the movable members 20-15.

Figure 15C:
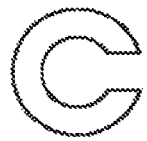
Figure 15D:
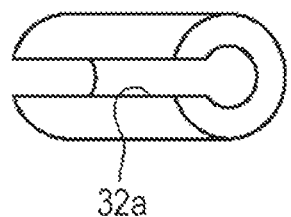
Figure 15E:
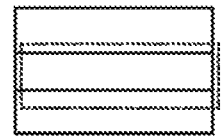

FIG. 16 illustrates a state where both the tape library device 200 and the server device 101c are in their enclosed positions. When the devices are in their enclosed positions, a stopper 32 illustrated in FIGS. 15C to 15E is attached to the shaft members 30 in order to prevent unexpected movement of the devices. FIG. 15C is a front view of the stopper 32. FIG. 15D is a perspective view of the stopper 32. FIG. 15E is a side view of the stopper 32. The stopper 32 is a cylindrical member and has a slit 32a in the side wall thereof. Thus, the stopper 32 is attachable to and detachable from the shaft members 30. As described above, FIG. 12A illustrates the movable members 20-11 to 20-15 in their enclosed positions. To the shaft members 30 are attached stoppers 32. More specifically, stoppers are attached between the shaft member attaching portions 11 and the bearing cylinder members 31. Since the movable members 20-11 to 20-15 illustrated in FIG. 12A are all in their enclosed positions, a stopper 32 is attached in front of the front sliding portion 21 and behind the back sliding portion 21 of each movable member 20. For the movable member 20-11 that has been moved backward as illustrated in FIG. 12B, the stopper 32 attached behind the back sliding portion 21 is removed and then attached in front of the front sliding portion 21, that is to say, two stoppers are attached in front of the front sliding portion 21. For the movable member 20-15 that has been moved forward as illustrated in FIG. 12B, the stopper 32 attached in front of the front sliding portion 21 is removed and then attached behind the back sliding portion 21, that is to say, two stoppers are attached behind the back sliding portion 21. This prevents unexpected movement of the movable members 20. Thus, maintenance and inspection can be safely performed.

Figure 18:
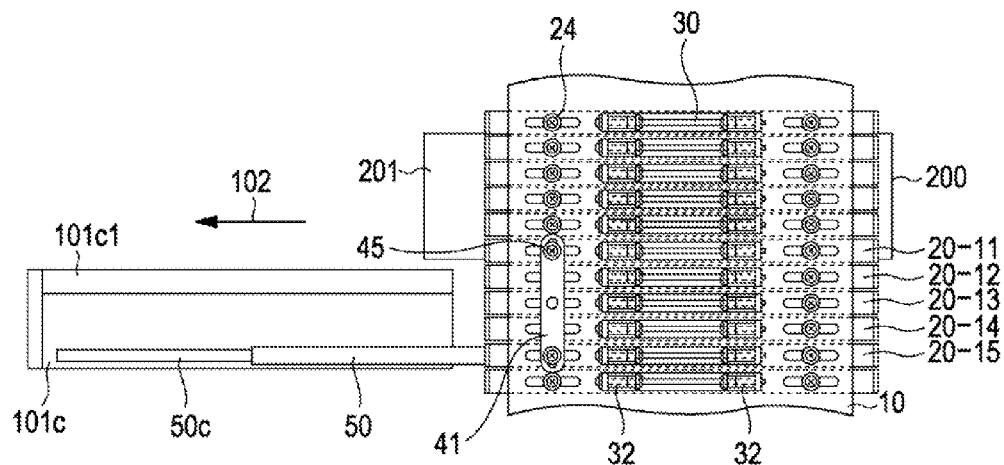
FIG. 18 is an explanatory view illustrating a state where the server device is pulled out forward using the rail devices.
Figure 19:
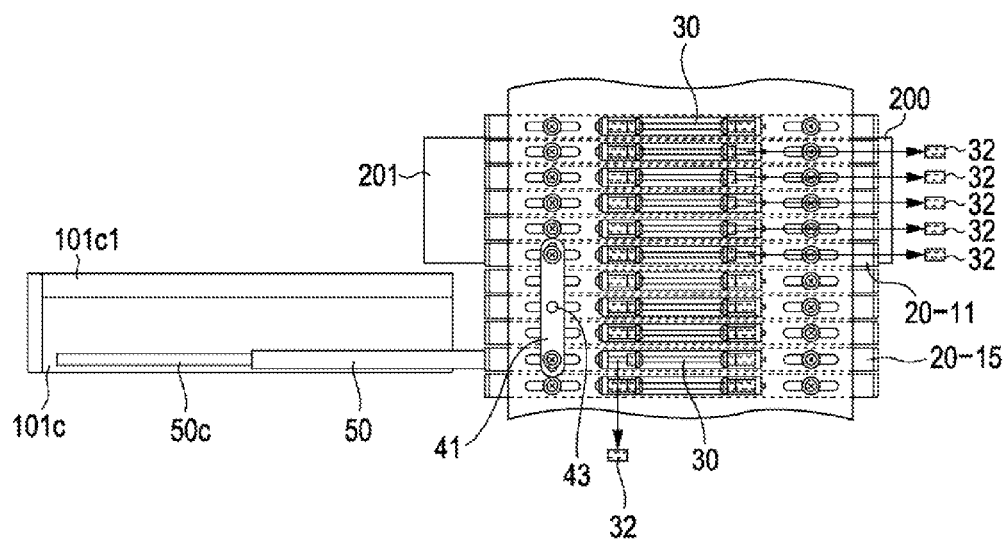
FIG. 19 is an explanatory view illustrating a state where the stoppers attached to the shaft members are being removed.
Figure 20:
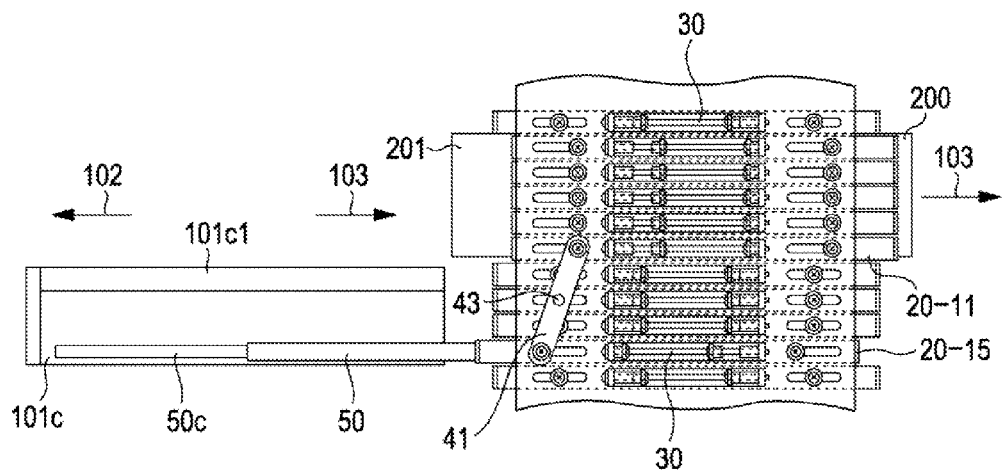
FIG. 20 is an explanatory view illustrating a state where the tape library device is moving backward in response to the forward movement of the server device.
Figure 21:
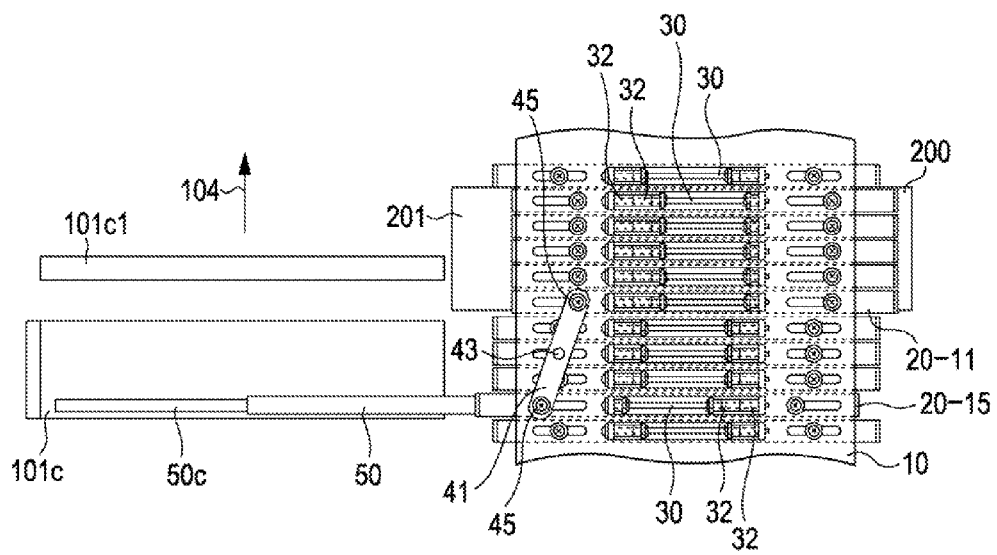
FIG. 21 is an explanatory view illustrating a state where the lid member of the server device is being removed.

Next, maintenance and inspection performed with the server device 101c pulled out forward from the enclosed state illustrated in FIG. 16 will be described with reference to FIGS. 18 to 21. FIG. 18 is an explanatory view illustrating a state where the server device 101c is pulled out forward as indicated by an arrow 102 using the rail devices 50. FIG. 19 is an explanatory view illustrating a state where the stoppers 32 attached to the shaft members 30 are being removed. FIG. 20 is an explanatory view illustrating a state where the tape library device 200 is moving backward as indicated by an arrow 103 in response to the forward movement of the server device 101c. FIG. 21 is an explanatory view illustrating a state where the lid member 101c1 of the server device 101c is being removed.

The server device 101c in the enclosed state illustrated in FIG. 16 is pulled out forward as illustrated in FIG. 18. The server device 101c illustrated in FIG. 18 has been moved forward using the rail devices 50 illustrated in FIG. 17. However, in the state illustrated in FIG. 18, the back end of the server device 101c and the front panel 201 of the tape library device 200 interfere with each other. For this reason, in this state, the lid member 101c1 attached to the top of the server device 101c cannot be removed.

To eliminate the interference between the server device 101c and the tape library device 200, the movable member 20-11 is moved backward and the movable member 20-15 is moved forward. First, as illustrated in FIG. 19, the stoppers 32 attached to the shaft members 30 of the five movable members 20 to which the tape library device 200 is fixed are removed. The five movable members 20 include the movable member 20-11 to which the linking member 41 is attached. The stoppers 32 attached at the back ends of the shaft members 30 of the five movable members 20 are removed. In addition, the stopper 32 attached to the shaft member 30 of the movable member 20-15 to which the server device 101c is fixed is removed.

Thereafter, the server device 101c is pulled forward as indicated by the arrow 102 in FIG. 20, and the tape library device 200 is moved backward as indicated by the arrow 103 in FIG. 20. This eliminates the interference between the back end of the server device 101c and the front panel 201 of the tape library device 200.

If the rail devices 50 are improved so that the server device 101c can be pulled farther forward, the interference between the server device 101c and the tape library device 200 can be avoided just by moving the server device 101c using the rail devices 50. If the interference can be avoided just by moving the server device 101c using the rail devices 50, the lid member 101c1 of the server device 101c can be removed without moving the tape library device 200 backward. However, in this case, the following problem may arise. If the server device 101c is pulled forward too far, the center of gravity is moved forward too far, and the rack apparatus 1000 may fall depending on the mounting position of the server device 101c. By moving the tape library device 200 backward as in this embodiment, the amount of forward movement of the server device 101c can be reduced, and therefore the amount of displacement of the center of gravity can be reduced.

Eliminating the interference between the back end of the server device 101c and the front panel 201 of the tape library device 200 as illustrated in FIG. 20 enables the lid member 101c1 to be removed as indicated by an arrow 104 in FIG. 21. This enables the server device 101c to undergo maintenance and inspection. At the time of maintenance and inspection, the stoppers 32 attached at the backs of the movable member 20-11 and four other movable members 20 that hold the tape library device 200 are transferred to the fronts of the shaft members 30. In addition, the stopper 32 attached at the front of the movable member 20-15 that holds the server device 101c is transferred to the back of the shaft member 30. This avoids unexpected movement of the server device 101c and the tape library device 200 and enables a worker to safely maintain and inspect the server device 101c. Not all of the stoppers 32 attached at the backs of the movable members 20 that hold the tape library device 200 is transferred to the fronts of the shaft members 30. It is important to transfer the stopper 32 attached at the back of at least one of the movable members 20 that hold the tape library device 200 to the front of the movable member 20.

As described above, the rack apparatus 1000 having the article holding device 500 of this embodiment is advantageous in that the work on an article held in a tier of the article holding device 500 is prevented from being interfered with by an article held in another tier.

Second Embodiment

Next, with reference to FIGS. 22 to 24, a second embodiment will be described. The second embodiment differs from the first embodiment in the length of the linking member. That is to say, the second embodiment uses a linking member 61 shorter than the linking member 41 in the first embodiment. By changing the length of linking member, articles of various sizes can be held in the article holding device 500.

Figure 22A:
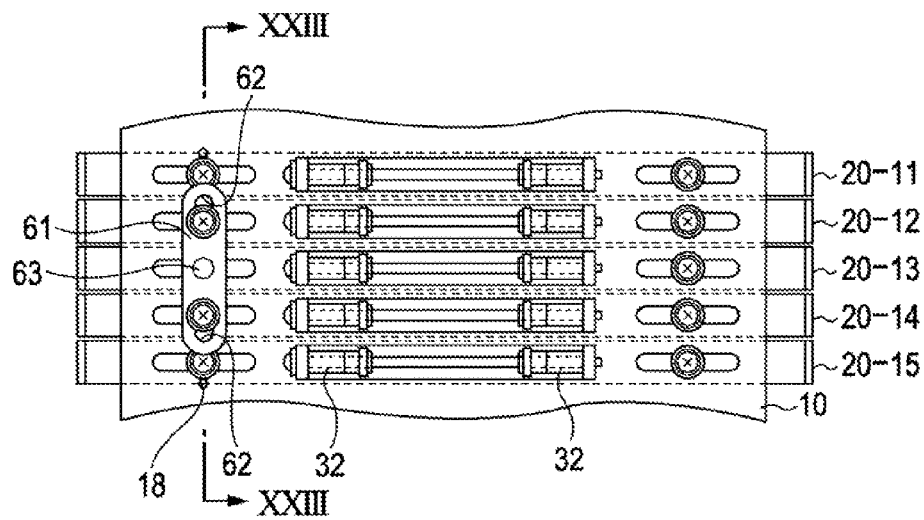
FIGS. 22A and 22B are explanatory views illustrating how movable members of a second embodiment are moved forward or backward.
Figure 22A:
Figure 22B:
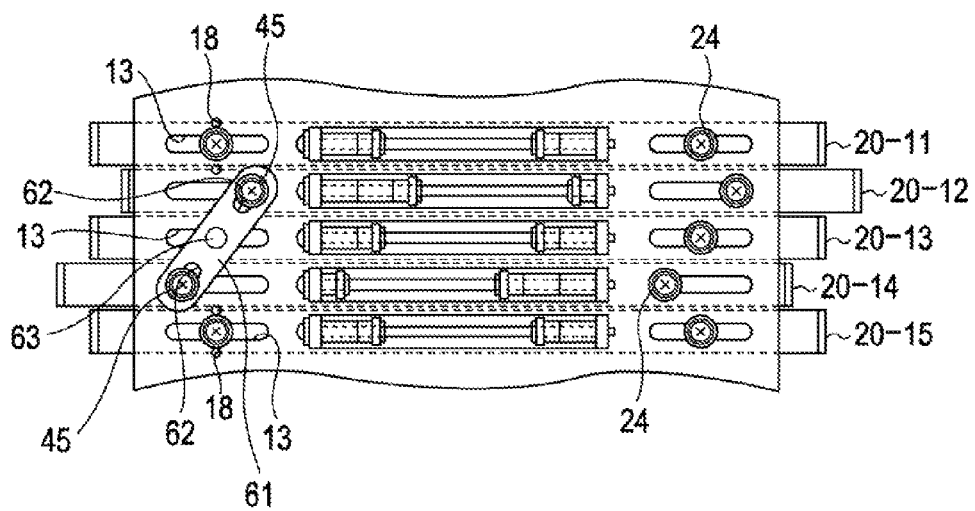

FIGS. 22A and 22B are explanatory views illustrating how movable members of the second embodiment are moved forward or backward. In the first embodiment, in order to hold the server device 101c having a height of 4 U, the movable member 20-11 serves as a first movable member, and the movable member 20-15 serves as a second movable member. In contrast, the second embodiment is assumed to hold a device having a height of 2 U instead of the server device 101c. Therefore, in the second embodiment, the movable member 20-12 serves as a first movable member, and the movable member 20-14 serves as a second movable member. The movable member 20-12 and the movable member 20-14 are linked using the linking member 61. FIG. 22A illustrates a state where the five movable members 20-11 to 20-15 are all in their enclosed position. FIG. 22B illustrates a state where the second movable member 20-14 has been moved forward and the first movable member 20-12 has been moved backward. By using the linking member 61, when one of the first movable member 20-12 and the second movable member 20-14 is moved forward, the other can be moved backward simultaneously.

Figure 23:
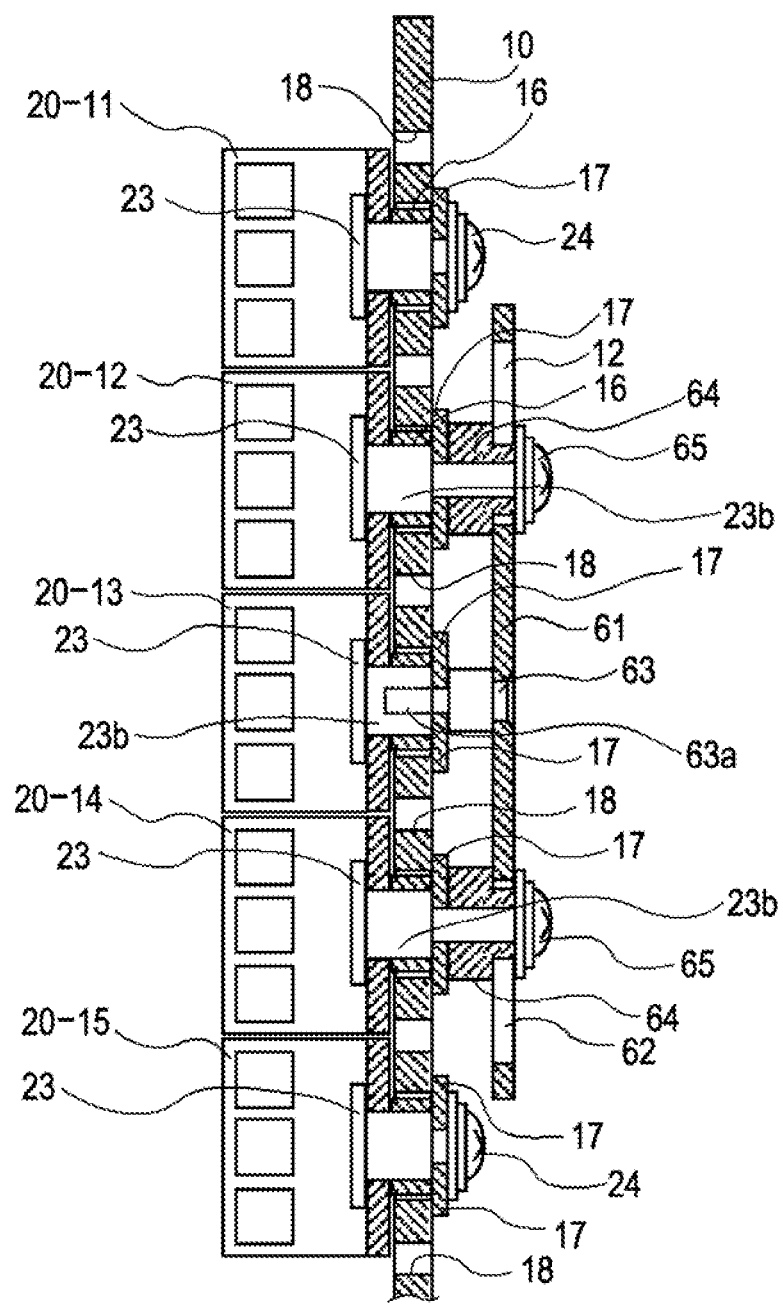
FIG. 23 is a sectional view taken along line XXIII-XXIII of FIG. 22A.
Figure 24A:
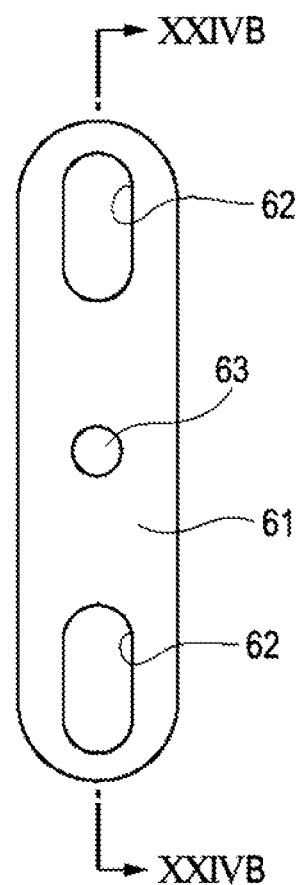
FIGS. 24A and 24B are explanatory views of a linking member.
Figure 24B:
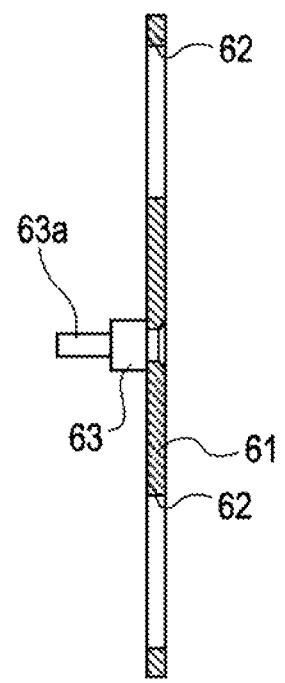

FIG. 23 is a sectional view taken along line XXIII-XXIII of FIG. 22A. FIG. 24 is an explanatory view of the linking member 61. More specifically, FIG. 24A is a side view of the linking member 61, and FIG. 24B is a sectional view taken along line XXIVB-XXIVB of FIG. 24A.

The linking member 61 and the linking member 41 have the same structure except for size. That is to say, the linking member 61 is a plate-like member and has an oval slot 62 at each end. In addition, the linking member 61 has a pivot portion 63 in the middle.

In each oval slot 62 is slidably fitted a bearing cylinder member 64. The bearing cylinder member 64 is the same component as the bearing cylinder member 44 in the first embodiment. The bearing cylinder members 64 are, together with the washer members 17 as illustrated in FIG. 23, attached with screw members 65 to the cylindrical portions 23b of the pin members 23. The bearing cylinder members 64 are attached to the pin members 23 of the first movable member 20-12 and the second movable member 20-14. Thus, the first movable member 20-12 and the second movable member 20-14 are linked.

The tip 63a of the pivot portion 63 is, as illustrated in FIG. 23, fitted into the cylindrical portion 23b of the pin member 23 provided in the movable member 20-13. That is to say, instead of the screw members 24 attached to the cylindrical portions 23b of the other pin members 23, the tip 63a is fitted. Also in this case, a bearing cylinder member 16 is attached to the cylindrical portion 23b. The movable member 20-13 is the middle one of the five movable members 20-11 to 20-15. Thus, the linking member 61 is supported by the base member 10 rotatably about the pivot portion 63. In this regard, this embodiment is the same as the first embodiment.

Thus, one of the first movable member 20-12 and the second movable member 20-14 moves in response to the movement of the other. The other components are the same as those in the first embodiment. Therefore, the same reference numerals will be used in the figures to designate the same components as those in the first embodiment, and the detailed description thereof will be omitted. The usage of the second embodiment is also the same as that of the first embodiment, and therefore the description thereof will be omitted. As described above, by changing the length of the linking member, articles of various sizes can be held in the article holding device 500.

Third Embodiment

Next, with reference to FIGS. 25 to 27, a third embodiment will be described. The third embodiment differs from the first embodiment in the length of the linking member. That is to say, the third embodiment uses a linking member 71 shorter than the linking member 41 in the first embodiment.

Figure 25A:
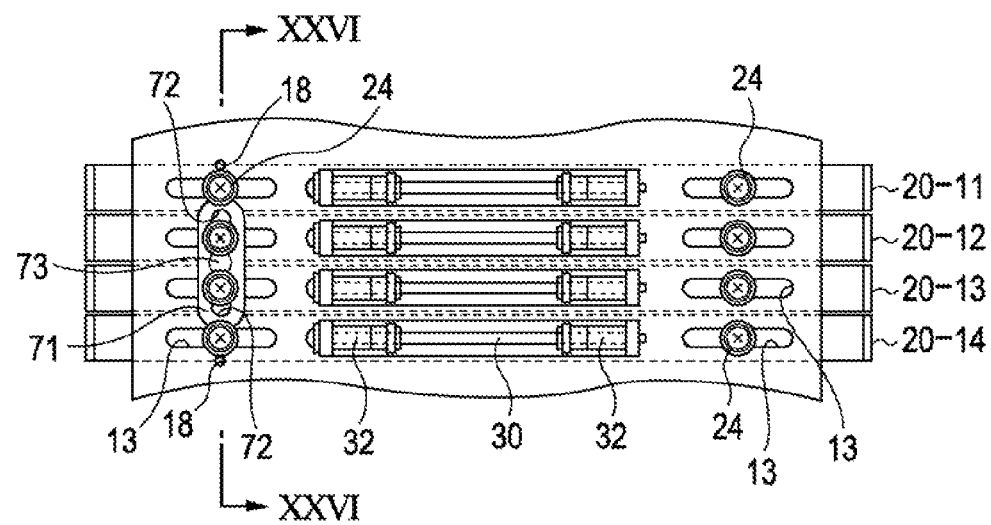
FIGS. 25A and 25B are explanatory views illustrating how movable members of a third embodiment are moved forward or backward.
Figure 25A:
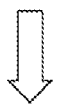
Figure 25B:
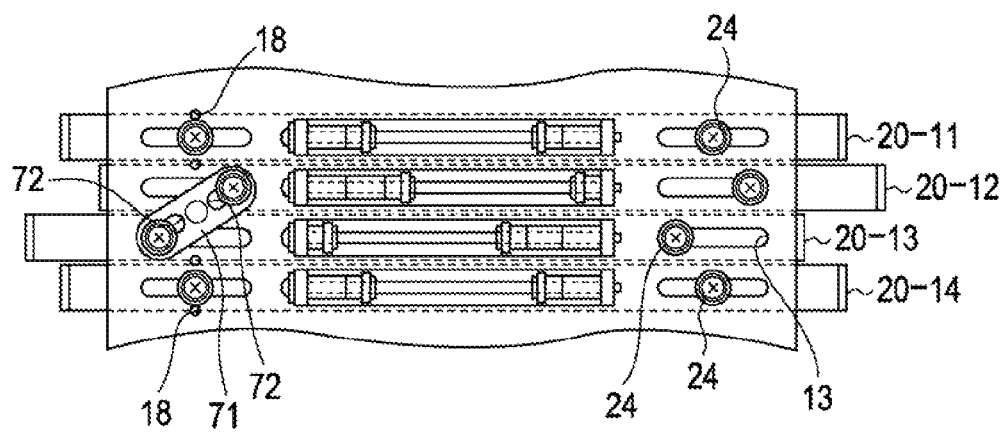

FIGS. 25A and 25B are explanatory views illustrating how movable members of the third embodiment are moved forward or backward. In the first embodiment, in order to hold the server device 101c having a height of 4 U, the movable member 20-11 serves as a first movable member, and the movable member 20-15 serves as a second movable member. In contrast, the third embodiment is assumed to hold a device having a height of 1 U instead of the server device 101c. Therefore, in the third embodiment, the movable member 20-12 serves as a first movable member, and the movable member 20-13 serves as a second movable member. The movable member 20-12 and the movable member 20-13 are linked using the linking members 71. FIG. 25A illustrates a state where four movable members 20-11 to 20-14 are all in their enclosed position. FIG. 25B illustrates a state where the second movable member 20-13 has been moved forward and the first movable member 20-12 has been moved backward. By using the linking member 71, when one of the first movable member 20-12 and the second movable member 20-13 is moved forward, the other can be moved backward simultaneously.

Figure 26:
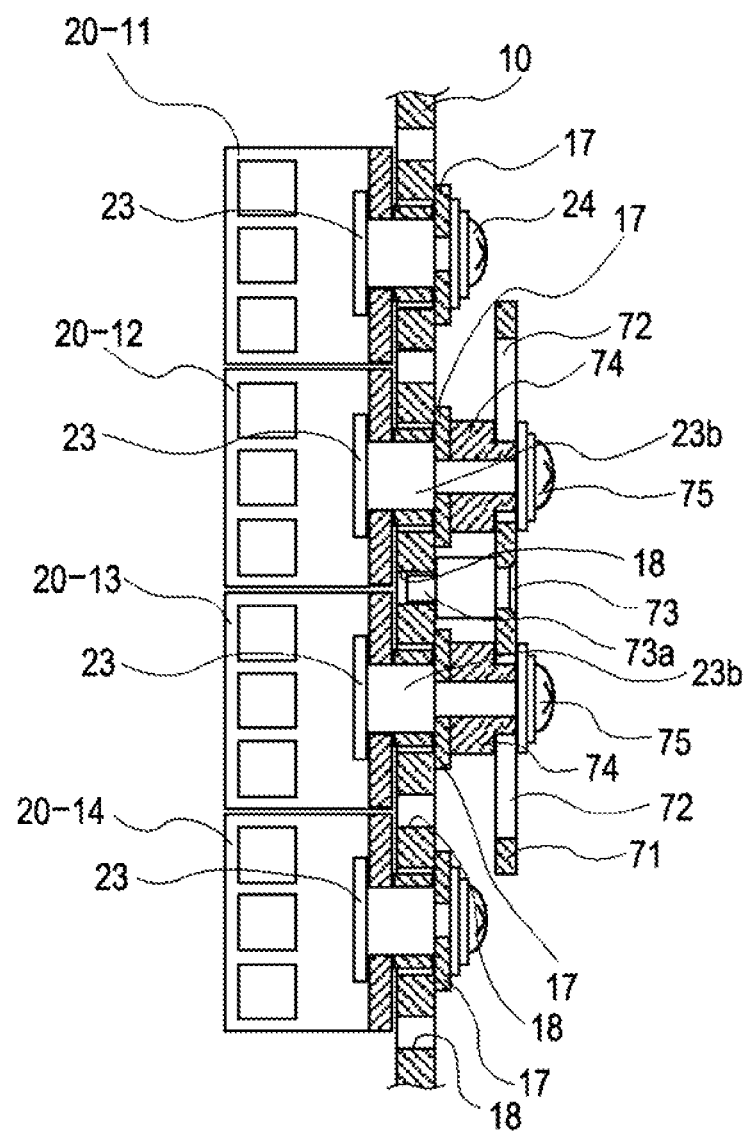
FIG. 26 is a sectional view taken along line XXVI-XXVI of FIG. 25A.
Figure 27A:
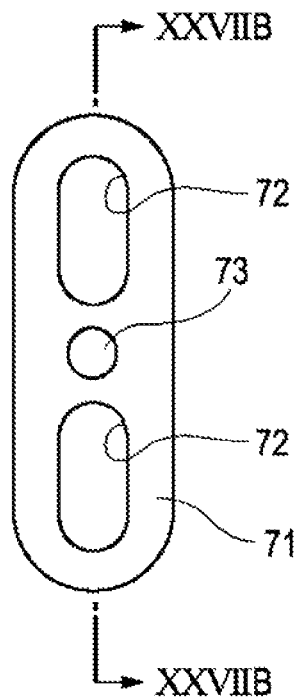
FIGS. 27A and 27B are explanatory views of a linking member.
Figure 27B:
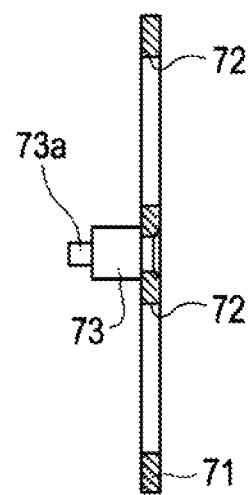

FIG. 26 is a sectional view taken along line XXVI-XXVI of FIG. 25A. FIG. 27 is an explanatory view of the linking member 71. More specifically, FIG. 27A is a side view of the linking member 71, and FIG. 27B is a sectional view taken along line XXVIIB-XXVIIB of FIG. 27A.

The linking member 71 and the linking member 41 have the same structure except for size. That is to say, the linking member 71 is a plate-like member and has an oval slot 72 at each end. In addition, the linking member 71 has a pivot portion 73 in the middle.

In each oval slot 72 is slidably fitted a bearing cylinder member 74. The bearing cylinder member 74 is the same component as the bearing cylinder member 44 in the first embodiment. The bearing cylinder members 74 are, together with the washer members 17 as illustrated in FIG. 26, attached with screw members 75 to the cylindrical portions 23b of the pin members 23. The bearing cylinder members 74 are attached to the pin members 23 of the first movable member 20-12 and the second movable member 20-13. Thus, the first movable member 20-12 and the second movable member 20-13 are linked.

This embodiment differs from the first and second embodiments in how the pivot portion 73 is attached to the base member 10. In the first and second embodiments, the pivot portion is fitted in the cylindrical portion 23b of the pin member 23 of the movable member located midway between the first and second movable members and is rotatably supported by the base member 10. The reason is that the linking member 41 of the first embodiment is for a device having a height of 4 U, and the linking member 61 of the second embodiment is for a device having a height of 4 U. That is to say, when the unit U in the height direction is an even number, the movable member located midway between the first and second movable members is identified, and therefore the pivot portion is attached to the pin member of the movable member located midway. However, the device held by the second movable member 20-13 of the third embodiment has a height of 1 U. For this reason, there is no movable member located midway between the first movable member 20-12 and the second movable member 20-13. So, in the third embodiment, as illustrated in FIG. 26, the tip 73a of the pivot portion 73 is fitted in one of shaft holes 18 provided in the base member 10. Thus, the linking member 71 is rotatably supported by the base member 10. The shaft holes 18 are, as illustrated in FIG. 25B, provided between the raceway slots 13 arranged vertically. Attaching the pivot portion 73 to the base member 10 in this manner makes the linking member 71 rotatable about the pivot portion 73.

Thus, one of the first movable member 20-12 and the second movable member 20-13 moves in response to the movement of the other. The other components are the same as those in the first embodiment. Therefore, the same reference numerals will be used in the figures to designate the same components as those in the first embodiment, and the detailed description thereof will be omitted. The usage of the third embodiment is also the same as that of the first embodiment, and therefore the description thereof will be omitted.

Fourth Embodiment

Next, with reference to FIGS. 28 and 29, a fourth embodiment will be described. The fourth embodiment differs from the third embodiment in the length of the linking member. That is to say, the fourth embodiment uses a linking member 81 longer than the linking member 71 in the third embodiment. The reason is that while the third embodiment is assumed to hold a device having a height of 1 U, the fourth embodiment is assumed to hold a device having a height of 3 U.

Figure 28A:
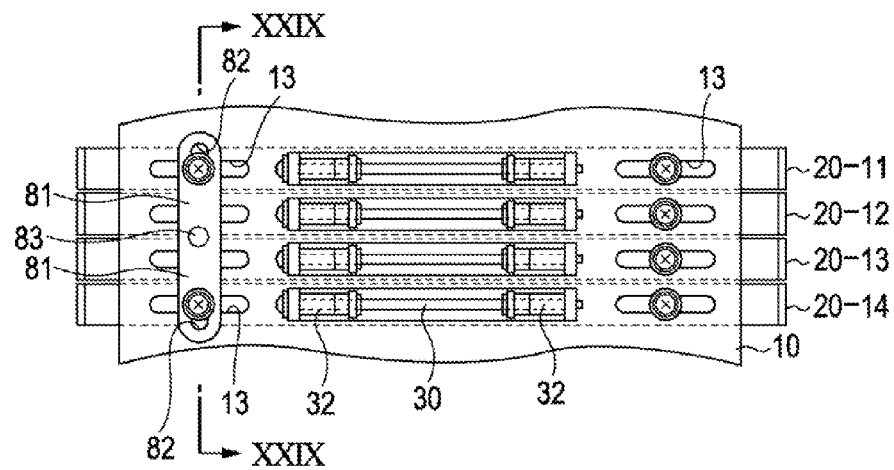
FIGS. 28A and 28B are explanatory views illustrating how movable members of a fourth embodiment are moved forward or backward.
Figure 28B:
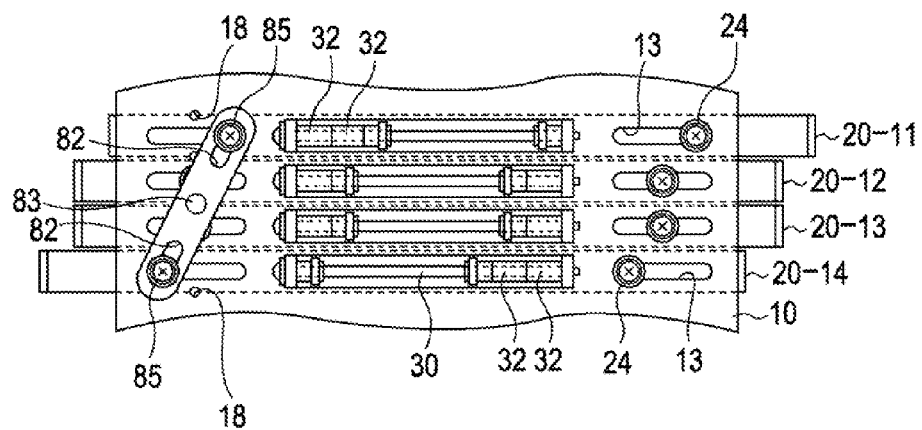

FIGS. 28A and 28B are explanatory views illustrating how movable members of the second embodiment are moved forward or backward. The fourth embodiment holds a device having a height of 3 U instead of the device having a height of 1 U in the third embodiment. Therefore, the movable member 20-11 serves as a first movable member, and the movable member 20-14 serves as a second movable member. The movable member 20-11 and the movable member 20-14 are linked using the linking members 81. FIG. 28A illustrates a state where four movable members 20-11 to 20-14 are all in their enclosed position. FIG. 28B illustrates a state where the second movable member 20-14 has been moved forward and the first movable member 20-11 has been moved backward. By using the linking member 81, when one of the first movable member 20-12 and the second movable member 20-13 is moved forward, the other can be moved backward simultaneously.

Figure 29:
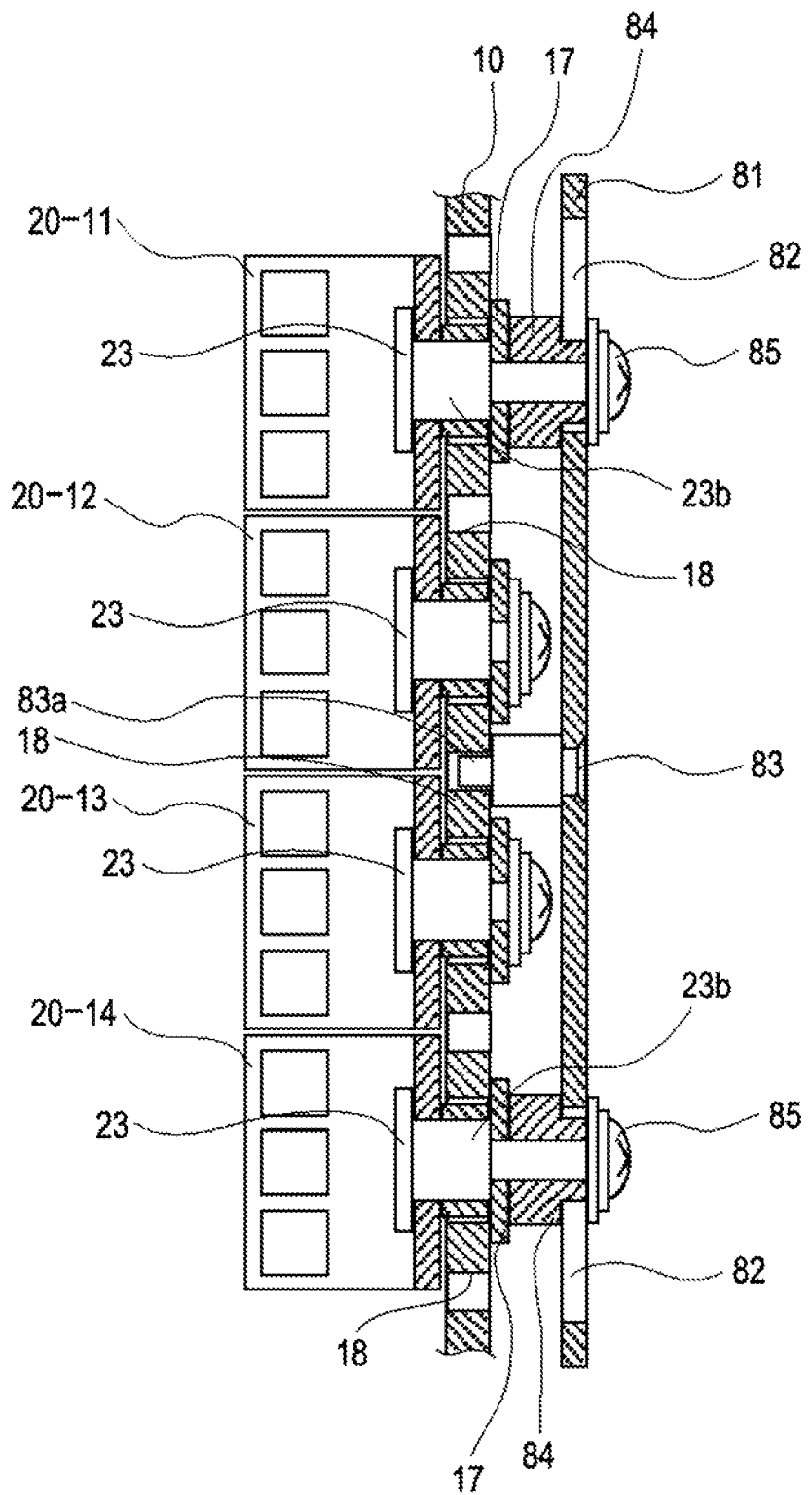
FIG. 29 is a sectional view taken along line XXIX-XXIX of FIG. 28A.

FIG. 29 is a sectional view taken along line XXIX-XXIX of FIG. 28A. The linking member 81 and the linking member 71 have the same structure except for size. That is to say, the linking member 81 is a plate-like member and has an oval slot 82 at each end. In addition, the linking member 81 has a pivot portion 83 in the middle.

In each oval slot 82 is slidably fitted a bearing cylinder member 84. The bearing cylinder member 84 is the same component as the bearing cylinder member 44 in the first embodiment. The bearing cylinder members 84 are, together with the washer members 17 as illustrated in FIG. 29, attached with screw members 85 to the cylindrical portions 23b of the pin members 23. The bearing cylinder members 84 are attached to the pin members 23 of the first movable member 20-11 and the second movable member 20-14. Thus, the first movable member 20-11 and the second movable member 20-14 are linked.

The pivot portion 83 is attached to the base member 10 in the same manner as in the third embodiment. That is to say, in the fourth embodiment, as illustrated in FIG. 29, the tip 83a of the pivot portion 83 is fitted in one of shaft holes 18 provided in the base member 10. The shaft holes 18 are, as illustrated in FIG. 28B, provided between the raceway slots 13 arranged vertically. Attaching the pivot portion 83 to the base member 10 in this manner makes the linking member 81 rotatable about the pivot portion 83.

Thus, one of the first movable member 20-11 and the second movable member 20-14 moves in response to the movement of the other. The other components are the same as those in the first embodiment. Therefore, the same reference numerals will be used in the figures to designate the same components as those in the first embodiment, and the detailed description thereof will be omitted. The usage of the fourth embodiment is also the same as that of the first embodiment, and therefore the description thereof will be omitted.

Fifth Embodiment

Next, with reference to FIG. 30, a fifth embodiment will be described. FIG. 30 is an explanatory view of a linking member 91. More specifically, FIG. 30A is a side view of a linking member 91, and FIG. 30B is a sectional view taken along line XXXB-XXXB of FIG. 30A. The linking member of the fifth embodiment differs from those of the other embodiments in the following respects. That is to say, the linking members 41, 61, 71, and 81 used in the first to fourth embodiments have a pivot portion in the middle thereof. In contrast, the linking member 91 of the fifth embodiment has a pivot portion 93 located away from the middle. If the linking member 91 illustrated FIGS. 30A and 30B is used, the linking member 91 is supported rotatably about a point closer to one of the first movable member and the second movable member than to the other.

As in the other embodiments, the linking member 91 is a plate-like member and has an oval slot 92 at each end. In addition, the linking member 91 has a pivot portion 93 in the middle. However, the pivot portion 93 is displaced in the longitudinal direction of the linking member 91. The distance by which the pivot portion 93 is displaced from the middle can be selected according to the length of the linking member 91 and the advantage obtained by displacing the pivot portion 93. The tip 93a of the pivot portion 93 can be fitted, according to its position, in the cylindrical portion 23b of the pin member 23 fitted in the raceway slot 13 as in the first and second embodiments. The tip 93a of the pivot portion 93 can also be fitted in one of the shaft holes 18 as in the third and fourth embodiments.

The advantage obtained by displacing the pivot portion 93 from the middle will be described. One of the first and second movable members moves in response to the movement of the other. That is to say, by applying a force to one, the other can also be moved simultaneously. The worker may apply a force to either movable member. When the worker operates the movable member to which is attached the end of the linking member 91 having the oval slot 92 located at a longer distance from the pivot portion 93, a small operational force is required compared to the case of the linking member having the pivot portion in the middle. That is to say, by moving the movable member to which is attached the end of the linking member 91 having the oval slot 92 located at a longer distance from the pivot portion 93, with a small operational force over a long distance, the interference between devices can be eliminated as in the other embodiments. The use of the linking member 91 having the pivot portion 93 displaced from the middle is effective in reducing the backward moving distance, for example, when the space behind the rack apparatus 1000 installed is narrow.

When the worker operates the movable member to which is attached the end of the linking member 91 having the oval slot 92 located at a shorter distance from the pivot portion 93, the moving distance is short compared to the case of the linking member having the pivot portion in the middle. That is to say, by moving the movable member to which is attached the end of the linking member 91 having the oval slot 92 located at a shorter distance from the pivot portion 93, with a large operational force over a short distance, the interference between devices can be eliminated as in the other embodiments.

Although preferred embodiments of the present art have been described above in detail, the present art is not limited to the specific embodiments, and various changes and modifications may be made therein without departing from the scope or spirit of the present art as defined in the appended claims. The article holding device can also be used, for example, in such a manner that a lower article is moved backward and an upper article is moved forward. In the above embodiments, an electronic device and another electronic device disposed just above it are moved in such a manner that one moves in response to the movement of the other. However, electronic devices or other articles spaced from each other may be moved in such a manner that one moves in response to the movement of the other.

The article holding device disclosed in this specification is advantageous in that the work on an article held in a tier of the article holding device is prevented from being interfered with by an article held in another tier.

As mentioned above, the present art has been specifically described for better understanding of the embodiments thereof and the above description does not limit other aspects of the art. Therefore, the present art can be altered and modified in a variety of ways without departing from the gist and scope thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A rack apparatus comprising:

a first movable member which holds a first article, and a second movable member which holds a second article, the first and second movable members being arranged vertically;

a base member which holds the first movable member and the second movable member so as to be movable forward and backward horizontally, the base member has a first shaft holding member and a second shaft holding member which holds a shaft member, the first and second shaft holding members being arranged in sliding direction of the movable members, and an opening between the first and second shaft holding members, the first and second movable members have a sliding portion which is slidable with respect to the shaft member; and a linking member which links the first movable member and the second movable member so as to enable the second movable member to move backward when the first movable member is moving forward.

2. The rack apparatus of claim 1, wherein the base member has a raceway slot on both sides of the first and second movable members, and the first and second movable members have a cylindrical portion projecting from the raceway slot.

3. The rack apparatus of claim 2, wherein the linking member has a first oval slot and a second oval slot at each end, the first oval slot attaching to the cylindrical portion of the first movable member, the second oval slot attaching to the cylindrical portion of the second movable member.

4. The rack apparatus of claim 3, wherein the linking member has a pivot portion between the first oval slot and the second oval slot, the pivot portion being fitted into a cylindrical portion of a third movable member so as to enable the linking member rotatably about the pivot portion, the third movable member being middle between the first movable member and the second movable member.

5. The rack apparatus of claim 1, wherein the first movable member has a supporting portion which mounts a rail device which supports the first article, the rail device being movable into and out of the first movable member.

* * * * *